(12) United States Patent
Kanaya

(10) Patent No.: US 7,700,987 B2
(45) Date of Patent: Apr. 20, 2010

(54) FERROELECTRIC MEMORY DEVICE AND METHOD OF MANUFACTURING THE SAME

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 683 days.

(21) Appl. No.: 11/276,781

(22) Filed: Mar. 14, 2006

(65) Prior Publication Data
US 2006/0244023 A1 Nov. 2, 2006

(30) Foreign Application Priority Data
Apr. 27, 2005 (JP) ............................. 2005-129539
Feb. 20, 2006 (JP) ............................. 2006-042737

(51) Int. Cl.
*H01L 27/108* (2006.01)
(52) U.S. Cl. ................ 257/306; 257/310; 257/E29.343
(58) Field of Classification Search ................. 257/295, 257/306, 310, E29.343
See application file for complete search history.

(56) References Cited

U.S. PATENT DOCUMENTS

| 6,603,161 | B2 | 8/2003 | Kanaya et al. |
| 6,677,630 | B1 | 1/2004 | Kanaya et al. |
| 6,762,065 | B2 | 7/2004 | Kanaya et al. |
| 6,855,565 | B2 | 2/2005 | Kanaya et al. |
| 2003/0119211 | A1* | 6/2003 | Summerfelt et al. ........... 438/3 |
| 2004/0169211 | A1* | 9/2004 | Zhuang et al. .............. 257/295 |
| 2006/0244023 | A1 | 11/2006 | Kanaya |

FOREIGN PATENT DOCUMENTS

| JP | 2001-36026 | 2/2001 |
| JP | 2001-257320 | 9/2001 |
| JP | 2004-356464 | 12/2004 |

OTHER PUBLICATIONS

U.S. Appl. No. 11/942,339, filed Nov. 19, 2007, Kanaya.
U.S. Appl. No. 11/858,361, filed Sep. 20, 2007, Kanaya.

* cited by examiner

*Primary Examiner*—Matthew E Warren
(74) *Attorney, Agent, or Firm*—Oblon, Spivak, McClelland, Maier & Neustadt, L.L.P.

(57) ABSTRACT

A ferroelectric memory device includes a top electrode, a bottom electrode, a ferroelectric film which is sandwiched between the top and bottom electrodes, includes a first portion having a side surface flushed with a side surface of the top electrode and a second portion having a side surface flushed with a side surface of the bottom electrode, and has a step formed by making the side surface of the second portion project outward from the side surface of the first portion, a top mask which is provided on the top electrode, and a side mask which is provided on part of a side surface of the top mask, the side surfaces of the top electrode and the first portion of the ferroelectric film and has a top at a lower level than a top of the top mask and at a higher level than a top of the top electrode.

7 Claims, 19 Drawing Sheets

FERROELECTRIC MEMORY DEVICE AND METHOD OF MANUFACTURING THE SAME

CROSS-REFERENCE TO RELATED APPLICATIONS

This application is based upon and claims the benefit of priority from prior Japanese Patent Applications No. 2005-129539, filed Apr. 27, 2005; and No. 2006-042737, filed Feb. 20, 2006, the entire contents of both of which are incorporated herein by reference.

BACKGROUND OF THE INVENTION

1. Field of the Invention

The present invention relates to a ferroelectric memory device and a method of manufacturing the same.

2. Description of the Related Art

Fine cell formation is required along with a recent increase in degree of integration of ferroelectric random access memory (FeRAM) devices. It is therefore essential to form ferroelectric capacitors by a batch process using one-mask (1PEP). However, in capacitors formed by a one-mask process, etching progresses also in the horizontal direction. Hence, variations in characteristics caused by damage and variations in dimensions pose a problem.

In, e.g., FIG. 2 of Jpn. Pat. Appln. KOKAI Publication No. 2001-36026, the above-described damage and variations in dimensions are improved. However, in the structure disclosed in Jpn. Pat. Appln. KOKAI Publication No. 2001-36026, the cell size is not sufficiently reduced in the horizontal direction (FIG. 9).

BRIEF SUMMARY OF THE INVENTION

According to a first aspect of the present invention, there is provided a ferroelectric memory device comprising a top electrode of a ferroelectric capacitor, a bottom electrode of the ferroelectric capacitor, a ferroelectric film which is sandwiched between the top electrode and the bottom electrode, includes a first portion having a side surface flushed with a side surface of the top electrode and a second portion having a side surface flushed with a side surface of the bottom electrode, and has a step formed by making the side surface of the second portion project outward from the side surface of the first portion, a top mask which is provided on the top electrode, and a side mask which is provided on part of a side surface of the top mask, the side surface of the top electrode, and the side surface of the first portion of the ferroelectric film and has a top at a lower level than a top of the top mask and at a higher level than a top of the top electrode.

According to a second aspect of the present invention, there is provided a ferroelectric memory device comprising a top electrode of a ferroelectric capacitor, a ferroelectric film of the ferroelectric capacitor, a bottom electrode of the ferroelectric capacitor, which includes a first portion having a side surface flushed with a side surface of the top electrode and a side surface of the ferroelectric film and a second portion having a side surface projecting outward from the side surface of the first portion and has a step formed by the first portion and the second portion, a top mask which is provided on the top electrode, and a side mask which is provided on part of a side surface of the top mask, the side surface of the top electrode, the side surface of the ferroelectric film, and the side surface of the first portion of the bottom electrode and has a top at a lower level than a top of the top mask and at a higher level than a top of the top electrode.

According to a third aspect of the present invention, there is provided a method of manufacturing a ferroelectric memory device, comprising forming a bottom electrode material, forming a ferroelectric film on the bottom electrode material, forming a top electrode material on the ferroelectric film, forming a top mask on the top electrode material, processing the top mask into a desired shape, processing the top electrode material and part of the ferroelectric film by using the top mask with the desired shape, forming a side mask on the top mask and the ferroelectric film, and forming a ferroelectric capacitor by partially removing the side mask to process a rest of the ferroelectric film and the bottom electrode material, wherein the side mask has a top at a lower level than a top of the top mask and at a higher level than a top of the top electrode material.

DETAILED DESCRIPTION OF THE INVENTION

Figure 1:
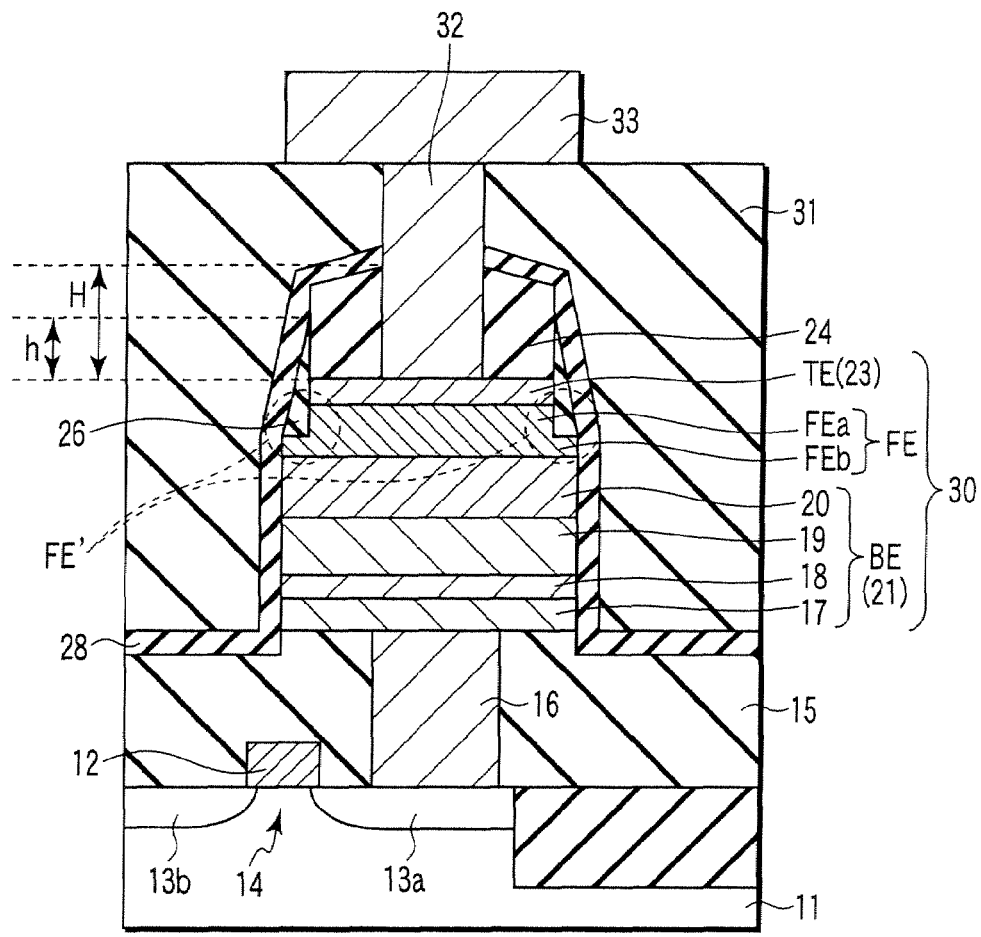
FIG. 1 is a sectional view showing a ferroelectric memory device according to the first embodiment of the present invention.

The embodiments of the present invention will be described below with reference to the accompanying drawing. In the following description, the same reference numerals denote the same parts throughout the drawing.

First Embodiment

FIG. 1 is a sectional view showing a ferroelectric memory device according to the first embodiment of the present invention. The ferroelectric memory device according to the first embodiment will be described below.

As shown in FIG. 1, a switching transistor 14 is formed on a silicon substrate 11. A ferroelectric capacitor 30 is connected to one of source/drain diffusion layers 13a and 13b of the transistor 14 through a plug 16. The ferroelectric capacitor 30 has a top electrode TE, bottom electrode BE, and ferroelectric film FE sandwiched between the top electrode TE and the bottom electrode BE.

The ferroelectric film FE has a first portion FEa having a side surface flushed with the side surface of the top electrode TE, and a second portion FEb having a side surface flushed with the side surface of the bottom electrode BE. Since the side surface of the second portion FEb projects outward from the side surface of the first portion FEa, the ferroelectric film FE has a step FE'. The side surface of the top electrode TE and that of the first portion FEa need not always be completely flushed with each other. A shift of about ±30% is allowable if the step FE' is formed between the first portion FEa and the second portion FEb.

A top hard mask 24 is provided on the top electrode TE. A side hard mask 26 is provided on part of the side surface of the top hard mask 24, the side surface of the top electrode TE, and the side surface of the first portion FEa of the ferroelectric film FE. The top of the side hard mask 26 is located at a higher level than the top of the top electrode TE and at a lower level than the top of the top hard mask 24.

Each of the top hard mask 24 and side hard mask 26 is formed from at least one of a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. The top hard mask 24 and side hard mask 26 can be made of either the same material or different materials.

A barrier film 28 covers the ferroelectric capacitor 30, top hard mask 24, and side hard mask 26. The barrier film 28 is formed from at least one of a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof.

A contact 32 is electrically connected to the ferroelectric capacitor 30 through the barrier film 28 and top hard mask 24. An interconnection 33 is connected to the contact 32.

Figure 2:
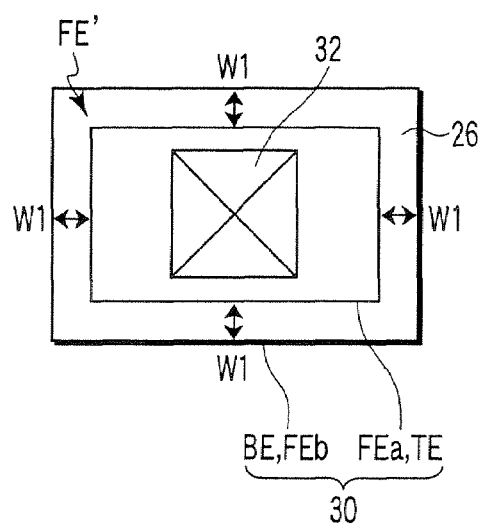
FIG. 2 is a schematic plan view showing a ferroelectric capacitor according to the first embodiment of the present invention.

FIG. 2 is a schematic plan view showing the ferroelectric capacitor according to the first embodiment of the present invention. The ferroelectric capacitor of the first embodiment will be described below.

As shown in FIG. 2, a projecting width W1 (the projecting length of the side surface of the second portion FEb of the ferroelectric film FE from the side surface of the first portion FEa) of the step FE' is uniform when viewed from right above. The top electrode TE and the first portion FEa of the ferroelectric film FE have the same planar shape. The bottom electrode BE and the second portion FEb of the ferroelectric film FE have the same planar shape. The planar shape of the bottom electrode BE and the second portion FEb of the ferroelectric film FE is larger than the planar shape of the top electrode TE and the first portion FEa of the ferroelectric film FE. The projecting width W1 of the step FE' may shift about ±30%. The planar shape of the top electrode TE and that of the first portion FEa of the ferroelectric film FE need not always be completely flushed with each other. A shift of about ±30% is allowable. The planar shape of the bottom electrode BE and that of the second portion FEb of the ferroelectric film FE need not always be completely flushed with each other. A shift of about ±30% is allowable.

Figure 3A:
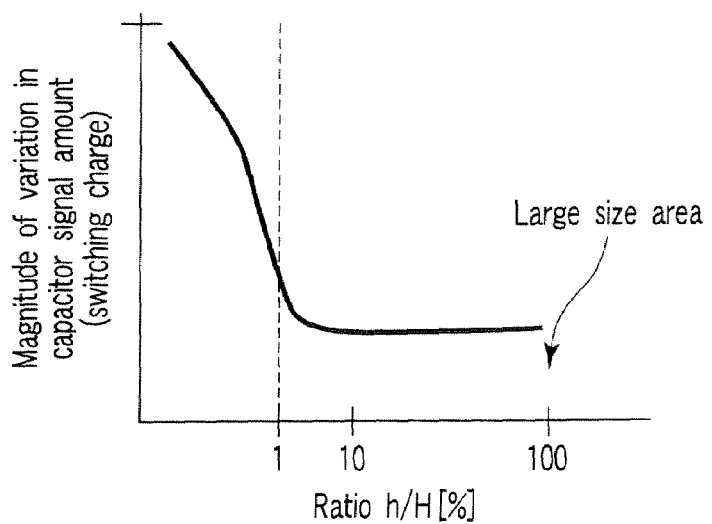
FIG. 3A is a graph showing the relationship between a ratio h/H and the magnitude of a variation in capacitor signal amount (switching charge) according to the first embodiment of the present invention.
Figure 3B:
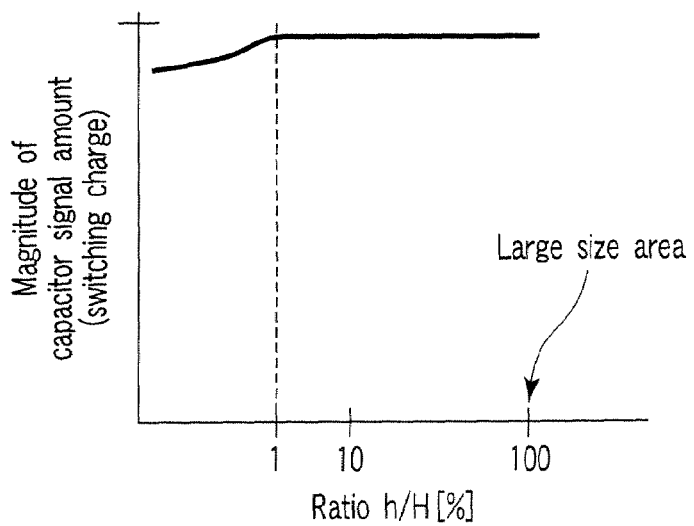
FIG. 3B is a graph showing the relationship between the ratio h/H and the magnitude of the capacitor signal amount (switching charge) according to the first embodiment of the present invention.
Figure 3C:
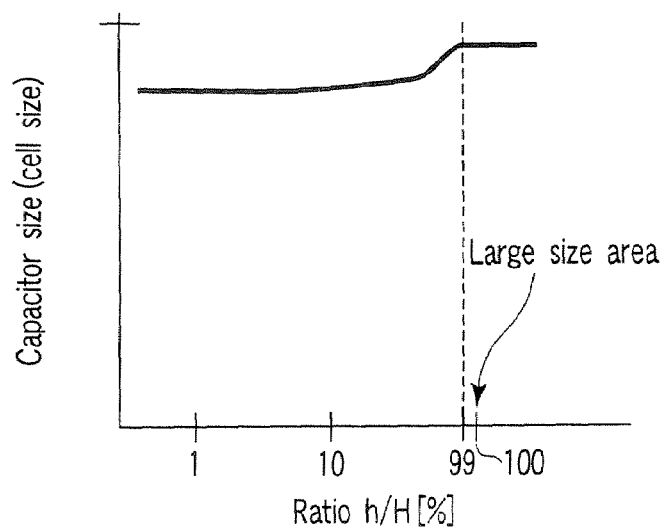
FIG. 3C is a graph showing the relationship between the ratio h/H and the capacitor size (cell size) according to the first embodiment of the present invention.

FIG. 3A shows the relationship between a ratio h/H and the magnitude of a variation in capacitor signal amount (switching charge) according to the first embodiment of the present invention. FIG. 3B shows the relationship between the ratio h/H and the magnitude of the capacitor signal amount (switching charge) according to the first embodiment of the present invention. FIG. 3C shows the relationship between the ratio h/H and the capacitor size (cell size) according to the first embodiment of the present invention. The ratio h/H according to the first embodiment will be described below.

Let H be the height from the top of the top electrode TE to the top of the top hard mask 24, and h be the height from the top of the top electrode TE to the top of the side hard mask 26 (FIG. 1). The ratio h/H preferably satisfies $$1\% \leq h/H \leq 99\% \tag{1}$$

The lower limit value of inequality (1) is defined from the following reason. As shown in FIG. 3A, the relationship between the ratio h/H and the magnitude of the variation in capacitor signal amount was examined. When the ratio h/H was 1% or more, the variation was reduced and saturated. As shown in FIG. 3B, the relationship between the ratio h/H and the magnitude of the capacitor signal amount was examined.

When the ratio h/H was 1% or more, the signal amount was increased and saturated. Hence, the ratio h/H is preferably 1% or more in consideration of the reduction of the variation in capacitor signal amount and the increase in capacitor signal amount.

The upper limit value of inequality (1) is defined from the following reason. As shown in FIG. 3C, the relationship between the ratio h/H and the capacitor size (cell size) was examined. When the ratio h/H was 99% or less, the capacitor size showed a tendency to be reduced and saturated. Hence, the ratio h/H is preferably 99% or less in consideration of the reduction of the capacitor size.

FIGS. 4 to 8 are sectional views showing steps in manufacturing the ferroelectric memory device according to the first embodiment of the present invention. The method of manufacturing the ferroelectric memory device according to the first embodiment will be described below.

Figure 4:
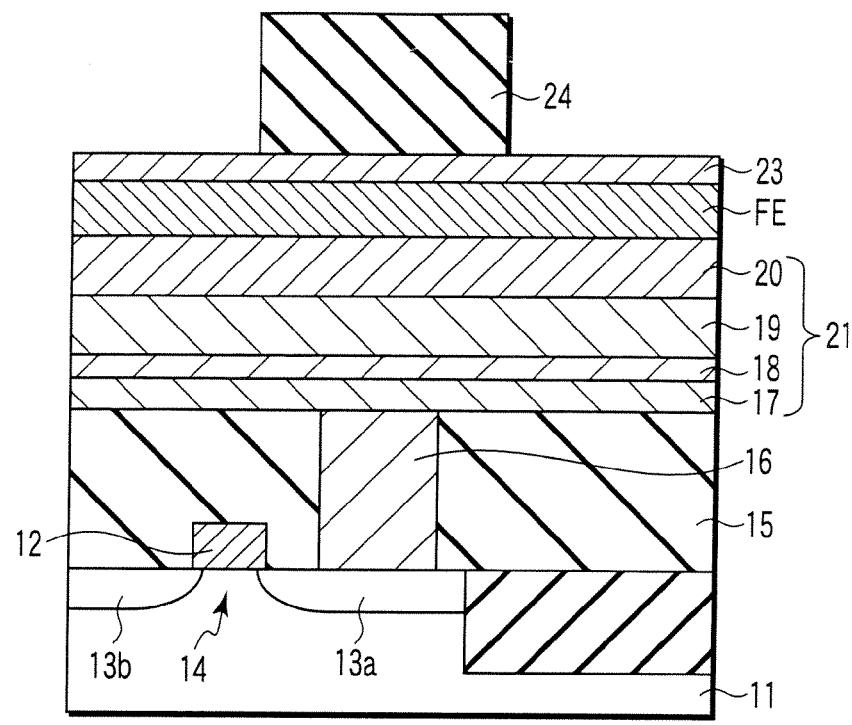
FIGS. 4 to 8 are sectional views showing steps in manufacturing the ferroelectric memory device according to the first embodiment of the present invention.

First, as shown in FIG. 4, a gate electrode 12 is formed on a gate insulating film (not shown) on the silicon substrate 11. The source/drain diffusion layers 13a and 13b are formed in the silicon substrate 11 on both sides of the gate electrode 12. The switching transistor 14 is thus formed. An interlayer dielectric film 15 is formed on the transistor 14. The plug 16 connected to the source/drain diffusion layer 13a is formed in the interlayer dielectric film 15.

A bottom electrode material 21, ferroelectric film FE, and top electrode material 23 are sequentially deposited on the plug 16 and interlayer dielectric film 15. The bottom electrode material 21 has, e.g., four layers of first to fourth bottom electrode materials 17 to 20. Examples of the first bottom electrode material 17 are TiAlN and Ti. An example of the second bottom electrode material 18 is Ir. An example of the third bottom electrode material 19 is $IrO_2$. An example of the fourth bottom electrode material 20 is $Ti/Pt/Ti/SrRuO_3$. An example of the ferroelectric film FE is PZT. Examples of the top electrode material 23 are $SrRuO_3/Pt$ and $SrRuO_3/IrO_x$.

The top hard mask 24 for the capacitor process is deposited on the top electrode material 23. The top hard mask 24 is processed into a desired shape by, e.g., lithography and reactive ion etching (RIE). In this embodiment, an $SiO_2$ film is used as the top hard mask 24 because high-temperature etching is used. As the top hard mask 24, for example, a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), silicon oxide film ($SiO_x$ film: e.g., $SiO_2$ film)/aluminum oxide film ($Al_xO_y$ film: e.g., $Al_2O_3$ film), silicon oxide film ($SiO_x$ film: e.g., $SiO_2$ film)/TiAlN film/aluminum oxide film ($Al_xO_y$ film: e.g., $Al_2O_3$ film), or a combination thereof is suitable.

Figure 5:
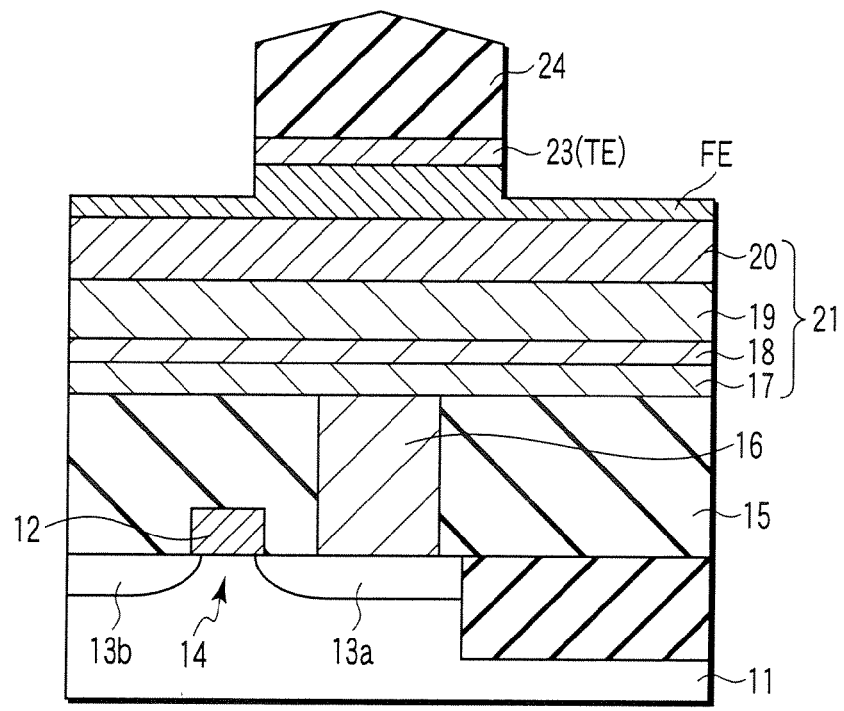

As shown in FIG. 5, the top electrode material 23 and part of the ferroelectric film FE are etched by using the top hard mask 24. In this etching process, etching conditions are applied such that no residue is formed by etching the top electrode material 23 and ferroelectric film FE. In this way, the top electrode TE with a desired pattern is formed.

Figure 6:
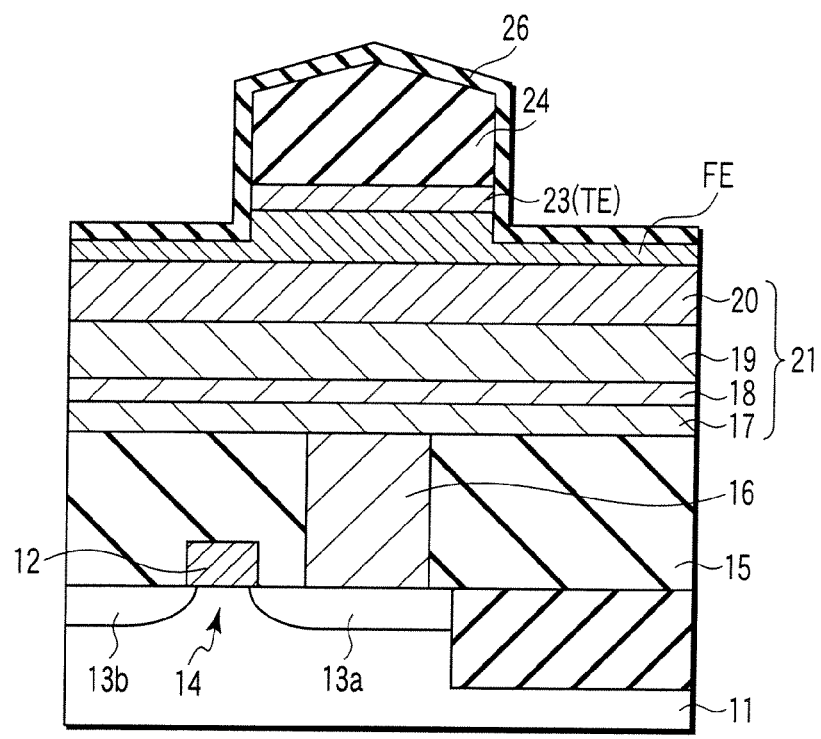

As shown in FIG. 6, the side hard mask 26 is formed on the etching surfaces of the top hard mask 24 and ferroelectric film FE. An aluminum oxide film ($Al_xO_y$ film: e.g., $Al_2O_3$ film) having a thickness of 10 to 50 nm is deposited by using one or both of atomic layer deposition (ALD) and sputtering. Candidates of the side hard mask 26 are a silicon oxide film ($SiO_x$ film: e.g., $SiO_2$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. After the side hard mask 26 is deposited, high-temperature oxygen annealing is executed as needed to improve the polarization characteristic of the ferroelectric capacitor.

Figure 7:
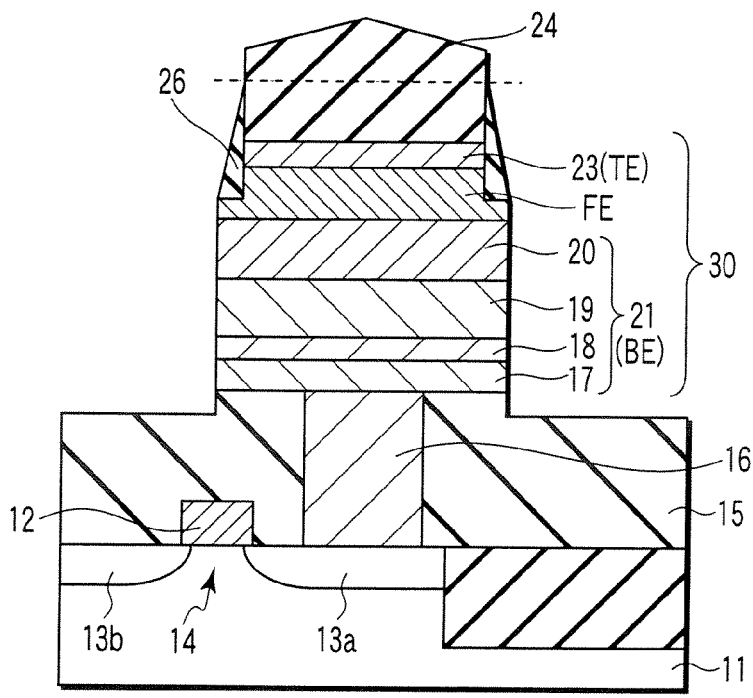

As shown in FIG. 7, the side hard mask 26 is partially removed by overall etch-back process. After that, etching is executed again to process the rest of the ferroelectric film FE and bottom electrode BE. With this process, the ferroelectric film FE and bottom electrode BE having a desired pattern are formed. The ferroelectric capacitor 30 is completed by above mentioned process. At this time, the side hard mask 26 is arranged on part of the side surface of the top hard mask 24. The top of the side hard mask 26 is at a lower level than the top of the top hard mask 24. The interlayer dielectric film 15 may also be partially processed.

Figure 8:
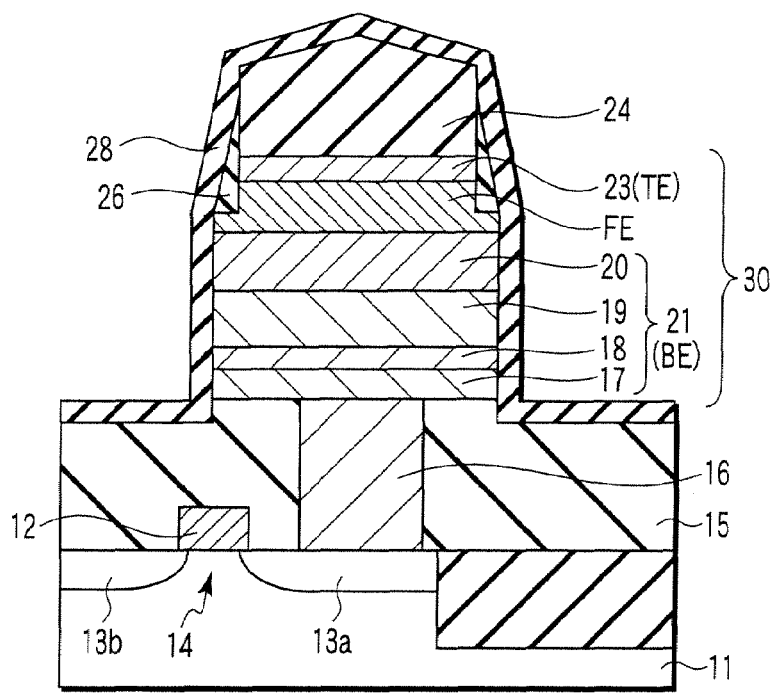

As shown in FIG. 8, the barrier film 28 is formed on the interlayer dielectric film 15 and top hard mask 24 to suppress damage to the interlayer dielectric film 15. Examples of the barrier film 28 are a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. In this case, an $Al_xO_y$ film having a thickness of 50 nm is deposited by using one or both of ALD and sputtering.

As shown in FIG. 1, an interlayer dielectric film 31 is formed on the barrier film 28. The contact 32 connected to the top electrode TE is formed through the interlayer dielectric film 31, barrier film 28, and top hard mask 24. Then, the interconnection 33 connected to the contact 32 is formed. The ferroelectric memory device is formed in this manner.

According to the first embodiment, the step FE' is formed on the ferroelectric film FE, and the side hard mask 26 is provided on the step FE'. The top of the side hard mask 26 is located at a higher level than the top of the top electrode TE and at a lower level than the top of the top hard mask 24. For this reason, the width of the ferroelectric capacitor 30 can be reduced in the first embodiment as compared to the structure with the side hard mask 26 and top hard mask 24 at the same level. Hence, the cell size can be reduced.

As indicated by inequality (1), when the ratio h/H is defined in the range of 1% (inclusive) to 99% (inclusive), the variation in signal amount can be reduced, and the signal amount can be increased while reducing the cell size.

If a ferroelectric capacitor with a step is formed by a two-mask process, the projecting width of the step cannot be uniform because of misalignment in lithography. In the first embodiment, however, the ferroelectric capacitor 30 is formed in one lithography (lithography of processing the top hard mask 24 into a desired shape) by using the one-mask process. Hence, misalignment can be suppressed, and the projecting width W1 of the step FE' can be made almost uniform (FIG. 2).

In etching shown in FIG. 7, the side surface of the top electrode TE is protected by the side hard mask 26. For this reason, the size error of the top electrode TE becomes small, and the ferroelectric capacitor 30 with a uniform size can be formed.

When the step FE' is formed on the ferroelectric film FE, the bottom electrode BE is not etched. Since the bottom electrode BE is not etched, the metal residue from the bottom electrode BE can be suppressed from being deposited on the sidewall of the ferroelectric film FE. Hence, any electrical connection (e.g., capacitor leakage) between the top electrode TE and the bottom electrode BE can be prevented structurally.

The side hard mask 26 is provided on the side surface of the top electrode TE and the side surface of the first portion FEa of the ferroelectric film FE. In this structure, the metal residue that is readily generated in etching the bottom electrode BE can be suppressed from being deposited directly on the sidewall of the top electrode TE as compared to a structure having no side hard mask 26. Hence, any electrical connection (e.g., capacitor leakage) between the top electrode TE and the bottom electrode BE can be prevented structurally.

When the barrier film 28 covers the ferroelectric capacitor 30, the following effect can be obtained as compared to a structure having no barrier film 28 covering the ferroelectric capacitor 30. Since the barrier film 28 can, e.g., suppress invasion of hydrogen into the ferroelectric capacitor 30, any degradation in characteristics of the ferroelectric capacitor 30 by hydrogen reduction action can be suppressed.

Second Embodiment

In the first embodiment, the step FE' is formed on the ferroelectric film FE. In the second embodiment, the step is formed on the bottom electrode of the ferroelectric capacitor.

Figure 10:
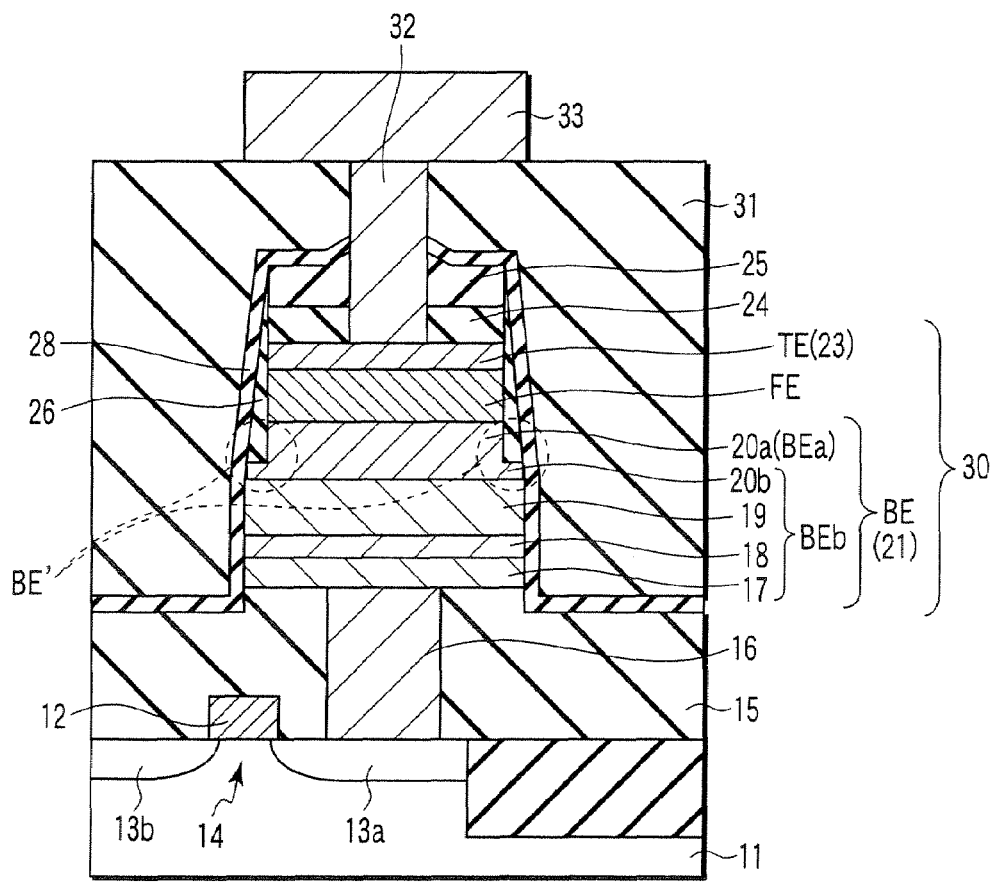
FIG. 10 is a sectional view showing a ferroelectric memory device according to the second embodiment of the present invention.
Figure 9:
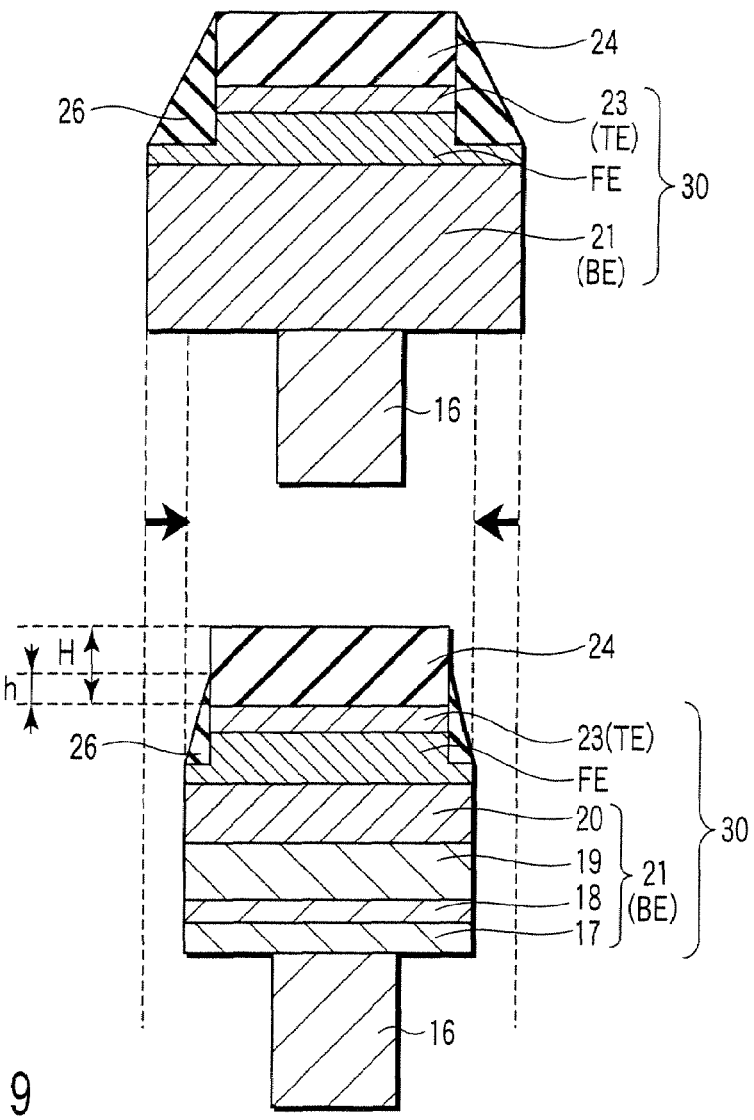
FIG. 9 is a view for explaining reduction of the width of the ferroelectric capacitor according to the first embodiment of the present invention.

FIG. 10 is a sectional view showing a ferroelectric memory device according to the second embodiment of the present invention. The ferroelectric memory device according to the second embodiment will be described below.

As shown in FIG. 10, the second embodiment is different from the first embodiment in that a step BE' is formed on a bottom electrode BE. Hence, the bottom electrode BE includes a first portion BEa and a second portion BEb which has a side surface projecting outward from the side surface of the first portion BEa. The side surface of the first portion BEa coincides with the side surfaces of a top electrode TE and ferroelectric film FE. The side surface of the top electrode TE, that of the ferroelectric film FE, and that of the first portion BEa need not always be completely flushed with each other. A shift of about ±30% is allowable if the step BE' is formed between the first portion BEa and the second portion BEb.

In the first embodiment, one top hard mask 24 is provided on the top electrode TE. In the second embodiment, two top hard masks 24 and 25 are provided on the top electrode TE. A side hard mask 26 is provided on the side surfaces of the first and second top hard masks 24 and 25, the side surface of the top electrode TE, the side surface of the ferroelectric film FE, and the side surface of the first portion BEa of the bottom electrode BE. The top of the side hard mask 26 is located almost at the same level as the end of the upper surface of the second top hard mask 25. The top of the side hard mask 26 need not always be located completely at the same level as the end of the upper surface of the second top hard mask 25. A shift of about ±25% is allowable.

The second top hard mask 25 mainly functions as a mask in processing the top electrode TE, ferroelectric film FE, and the first portion BEa of the bottom electrode BE. The first top hard mask 24 mainly functions as a mask in processing the second portion BEb of the bottom electrode BE. The first top hard mask 24 also prevents damage to the second top hard mask 25 from influencing the top electrode TE.

Of the first and second top hard masks 24 and 25, at least part of the first top hard mask 24 is preferably left on the top electrode TE. This is because if the first top hard mask 24 on the top electrode TE is wholly etched after processing a ferroelectric capacitor 30, the top electrode TE is damaged.

The material of the first top hard mask 24 preferably has a higher selectivity with respect to a bottom electrode material 21. This is because the ferroelectric capacitor 30 becomes long in the vertical direction, resulting in advantage for micropatterning.

Each of the first and second top hard masks 24 and 25 and the side hard mask 26 is formed from at least one of a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. The top hard masks 24 and 25 and side hard mask 26 can be made of either the same material or different materials. The first and second top hard masks 24 and 25 may be made of the same material but are preferably formed from different materials.

In this embodiment, two top hard masks 24 and 25 are formed. However, three or more layers may be formed.

Figure 11:
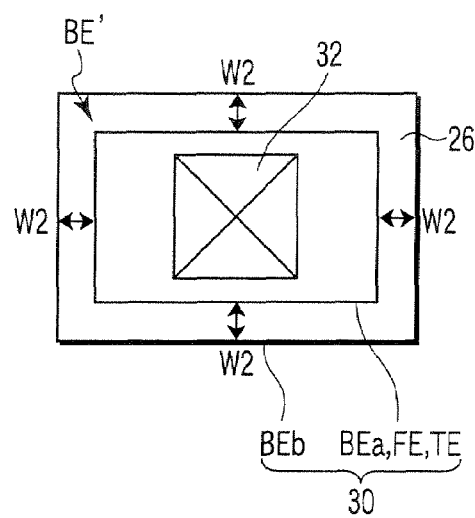
FIG. 11 is a schematic plan view showing a ferroelectric capacitor according to the second embodiment of the present invention.

FIG. 11 is a schematic plan view showing the ferroelectric capacitor according to the second embodiment of the present invention. The ferroelectric capacitor according to the second embodiment will be described below.

As shown in FIG. 11, a projecting width W2 (the projecting length of the side surface of the second portion BEb of the bottom electrode BE from the side surface of the first portion BEa) of the step BE' is uniform when viewed from right above. The top electrode TE, the ferroelectric film FE, and the first portion BEa of the bottom electrode BE have the same planar shape. The planar shape of the second portion BEb of the bottom electrode BE is larger than the planar shape of the top electrode TE, the ferroelectric film FE, and the first portion BEa of the bottom electrode BE. The projecting width W2 of the step BE' may shift about ±30%. The planar shapes of the top electrode TE, the ferroelectric film FE, and the first portion BEa of the bottom electrode BE need not always be completely flushed with each other. A shift of about ±30% is allowable.

Figure 12:
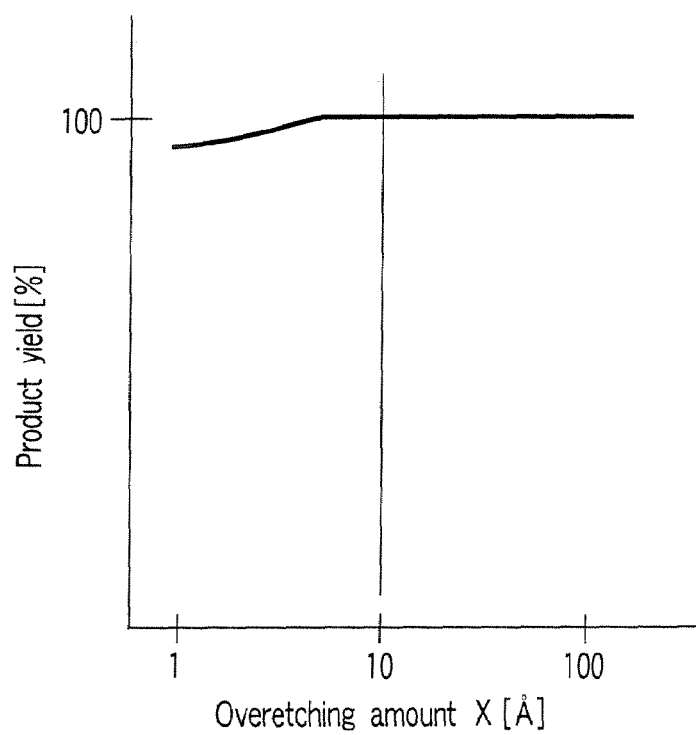
FIG. 12 is a graph showing the relationship between the bottom electrode overetching amount and the product yield according to the second embodiment of the present invention.

FIG. 12 shows the relationship between the bottom electrode overetching amount and the product yield according to the second embodiment of the present invention. The step according to the second embodiment will be described below.

As shown in FIG. 12, when an overetching amount (the distance from the upper surface of the first portion BEa of the bottom electrode to the upper surface of the second portion BEb of the bottom electrode BE) X of the bottom electrode BE was 1 nm or more, the product yield increased. In consideration of improvement of product yield, the overetching amount X preferably satisfies $$X \geq 1 \text{ nm} \tag{2}$$

FIGS. 13 to 17 are sectional views showing steps in manufacturing the ferroelectric memory device according to the second embodiment of the present invention. The method of manufacturing the ferroelectric memory device according to the second embodiment will be described below.

Figure 13:
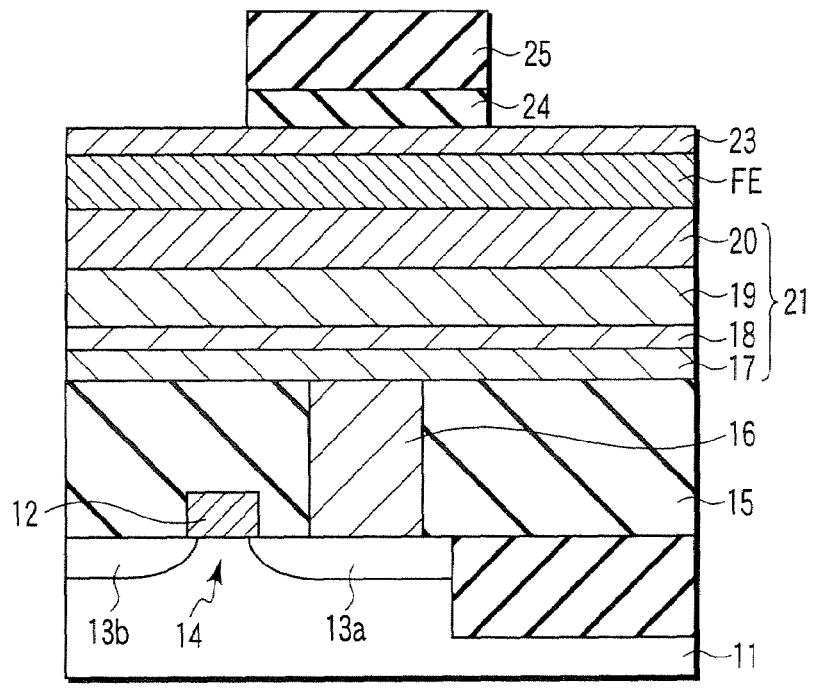
FIGS. 13 to 17 are sectional views showing steps in manufacturing the ferroelectric memory device according to the second embodiment of the present invention.

First, as shown in FIG. 13, a gate electrode 12 is formed on a gate insulating film (not shown) on a silicon substrate 11. Source/drain diffusion layers 13a and 13b are formed in the silicon substrate 11 on both sides of the gate electrode 12. A switching transistor 14 is thus formed. An interlayer dielectric film 15 is formed on the transistor 14. A plug 16 connected to the source/drain diffusion layer 13a is formed in the interlayer dielectric film 15.

A bottom electrode material 21, ferroelectric film FE, and top electrode material 23 are sequentially deposited on the plug 16 and interlayer dielectric film 15. The bottom electrode material 21 has, e.g., four layers of first to fourth bottom electrode materials 17 to 20. Examples of the first bottom electrode material 17 are TiAlN and Ti. An example of the second bottom electrode material 18 is Ir. An example of the third bottom electrode material 19 is $IrO_2$. An example of the fourth bottom electrode material 20 is Ti/Pt/Ti/$SrRuO_3$. An example of the ferroelectric film FE is PZT. Examples of the top electrode material 23 are $SrRuO_3/Pt$ and $SrRuO_3/IrO_x$.

The first and second top hard masks 24 and 25 for the capacitor process are deposited on the top electrode material 23. The second top hard mask 25 is processed into a desired shape by, e.g., lithography and RIE. The first top hard mask 24 is processed into a desired shape by using the processed second top hard mask 25. In this embodiment, a silicon oxide film ($SiO_x$ film: e.g., $SiO_2$ film) is used as the first top hard mask 24, and an aluminum oxide film ($Al_xO_y$ film: e.g., $Al_2O_3$ film) is used as the second top hard mask 25 because high-temperature etching is used. As the first and second top hard masks 24 and 25, for example, a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), silicon oxide film ($SiO_x$ film: e.g., $SiO_2$ film)/aluminum oxide film ($Al_xO_y$ film: e.g., $Al_2O_3$ film), silicon oxide film ($SiO_x$ film: e.g., $SiO_2$ film)/TiAlN film/aluminum oxide film ($Al_xO_y$ film: e.g., $Al_2O_3$ film), or a combination thereof is suitable.

Figure 14:
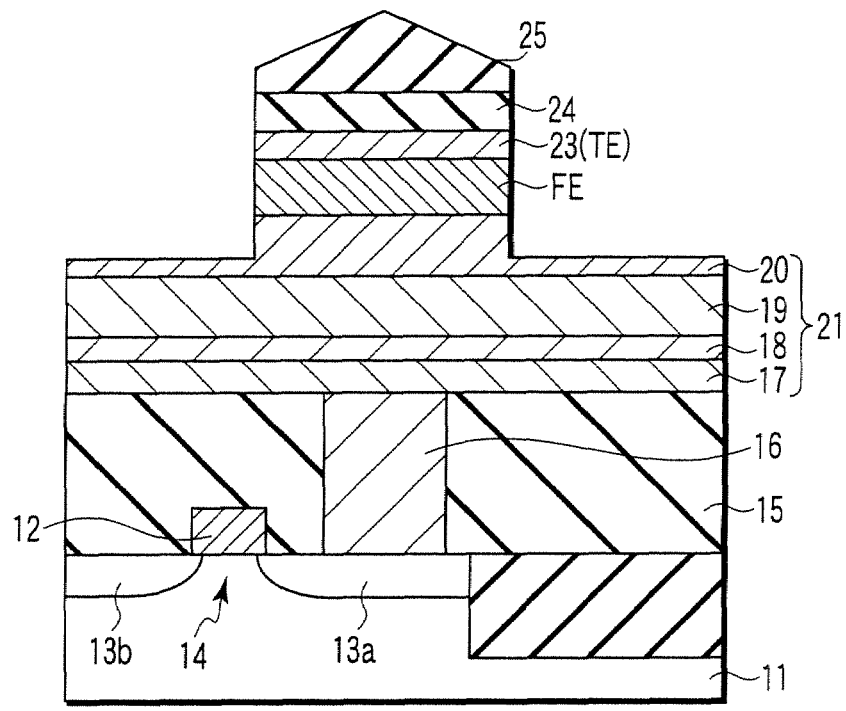

As shown in FIG. 14, the top electrode material 23, the ferroelectric film FE, and part of the bottom electrode 21 are etched by using the first and second top hard masks 24 and 25. In this etching process, etching conditions are applied such that no residue is formed by etching the top electrode material 23, ferroelectric film FE, and bottom electrode material 21. In this way, the top electrode TE and ferroelectric film FE with a desired pattern are formed. Etching may temporarily be stopped at the boundary between the ferroelectric film FE and the bottom electrode material 21.

Figure 15:
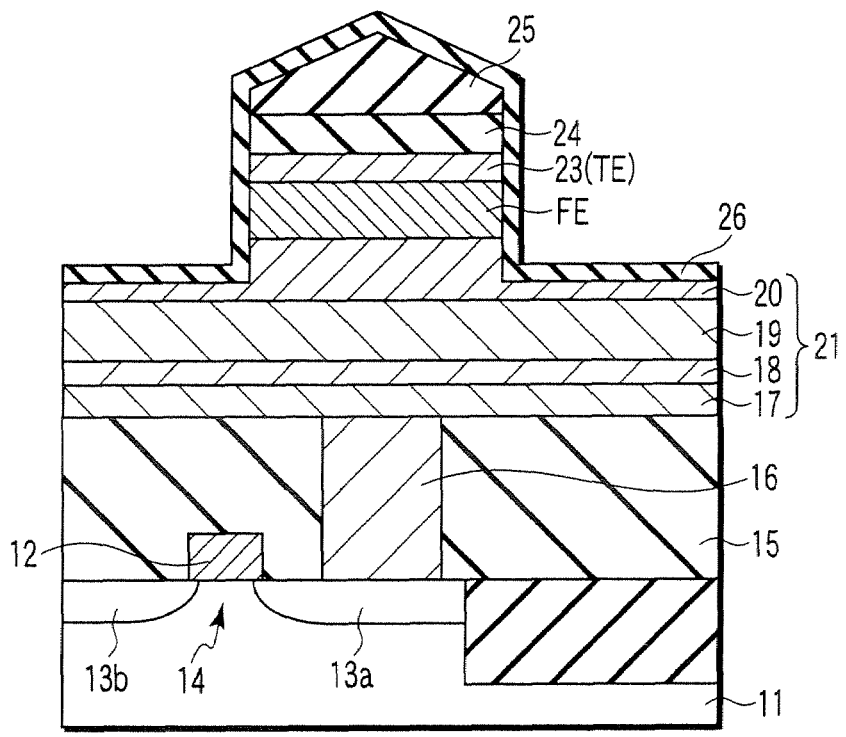

As shown in FIG. 15, the side hard mask 26 is formed on the etching surfaces of the second top hard mask 25 and fourth bottom electrode material 20. An aluminum oxide film ($Al_xO_y$ film: e.g., $Al_2O_3$ film) having a thickness of 10 to 50 nm is deposited by using one or both of ALD and sputtering. Candidates of the side hard mask 26 are a silicon oxide film ($SiO_x$ film: e.g., $SiO_2$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. After the side hard mask 26 is deposited, high-temperature oxygen annealing is executed as needed to improve the polarization characteristic of the ferroelectric capacitor.

Figure 16:
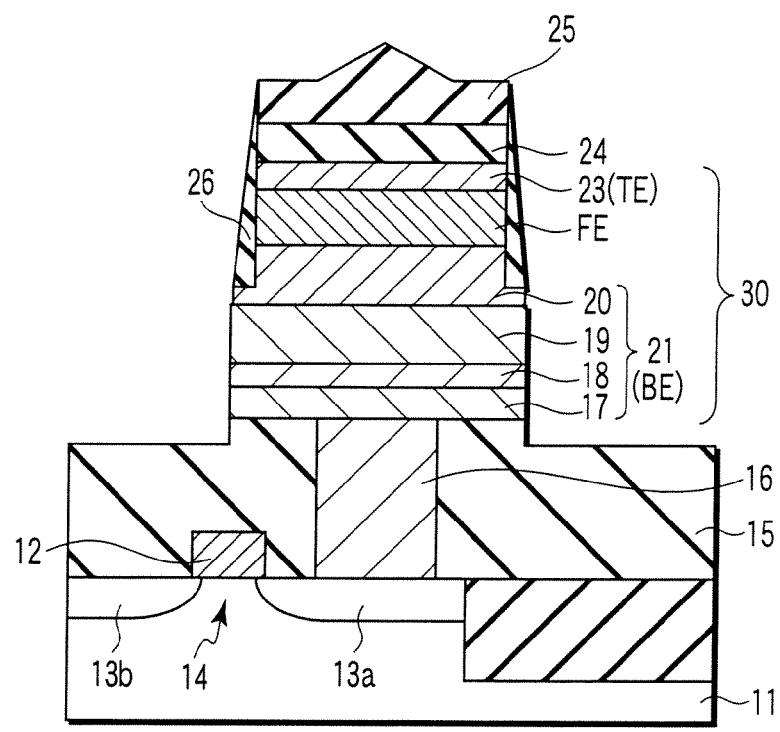

As shown in FIG. 16, the side hard mask 26 is partially removed by overall etchback. After that, etching is executed again to process the rest of the bottom electrode material 21 (the first to third bottom electrode materials 17 to 19 and part of the fourth bottom electrode material 20). With this process, the bottom electrode BE having a desired pattern is formed. The ferroelectric capacitor 30 is completed by the batch process. The interlayer dielectric film 15 may also be partially processed.

Figure 17:
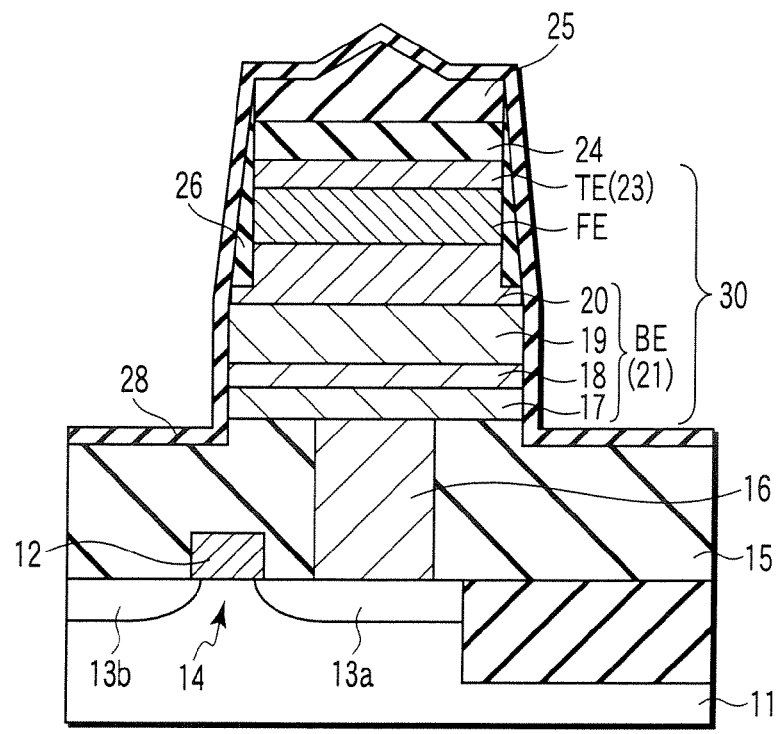

As shown in FIG. 17, a barrier film 28 is formed on the interlayer dielectric film 15 and second top hard mask 25 to suppress damage to the interlayer dielectric film 15. Examples of the barrier film 28 are a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. In this case, an $Al_xO_y$ film having a thickness of 50 nm is deposited by using one or both of ALD and sputtering.

As shown in FIG. 10, an interlayer dielectric film 31 is formed on the barrier film 28. A contact 32 connected to the top electrode TE is formed through the interlayer dielectric film 31, barrier film 28, and first and second top hard masks 24 and 25. Then, an interconnection 33 connected to the contact 32 is formed. The ferroelectric memory device is formed in this manner.

According to the second embodiment, the following effects can be obtained.

In the capacitor structure of the one-mask process, as in Jpn. Pat. Appln. KOKAI Publication No. 2001-36026, an etching step is formed midway on the ferroelectric film of a ferroelectric capacitor formed by 1PEP (one lithography process). The major object of this structure is to eliminate any electrical short circuit between the top electrode and the bottom electrode by a metallic residue formed in overetching the bottom electrode. However, as is apparent from experiments conducted by the present inventors, etching damage to the sidewall of the ferroelectric film occurs in the second half of etching of the bottom electrode. That is, damage to the side surface of the ferroelectric capacitor can hardly be suppressed in etching the bottom electrode.

In the second embodiment, the sidewall of the ferroelectric film FE is protected by the side hard mask 26 in the second half of etching of the bottom electrode material 21. Hence, damage by etching can be suppressed. The sidewall of the top electrode TE is also protected by the side hard mask 26. For this reason, the size error of the top electrode TE becomes small, and the ferroelectric capacitor 30 with a uniform size can be formed.

As indicated by inequality (2), when the overetching amount of the bottom electrode BE defined to be 1 nm or more, the product yield can be improved.

Third Embodiment

The third embodiment is a modification to the second embodiment. Two side hard masks are used.

Figure 18:
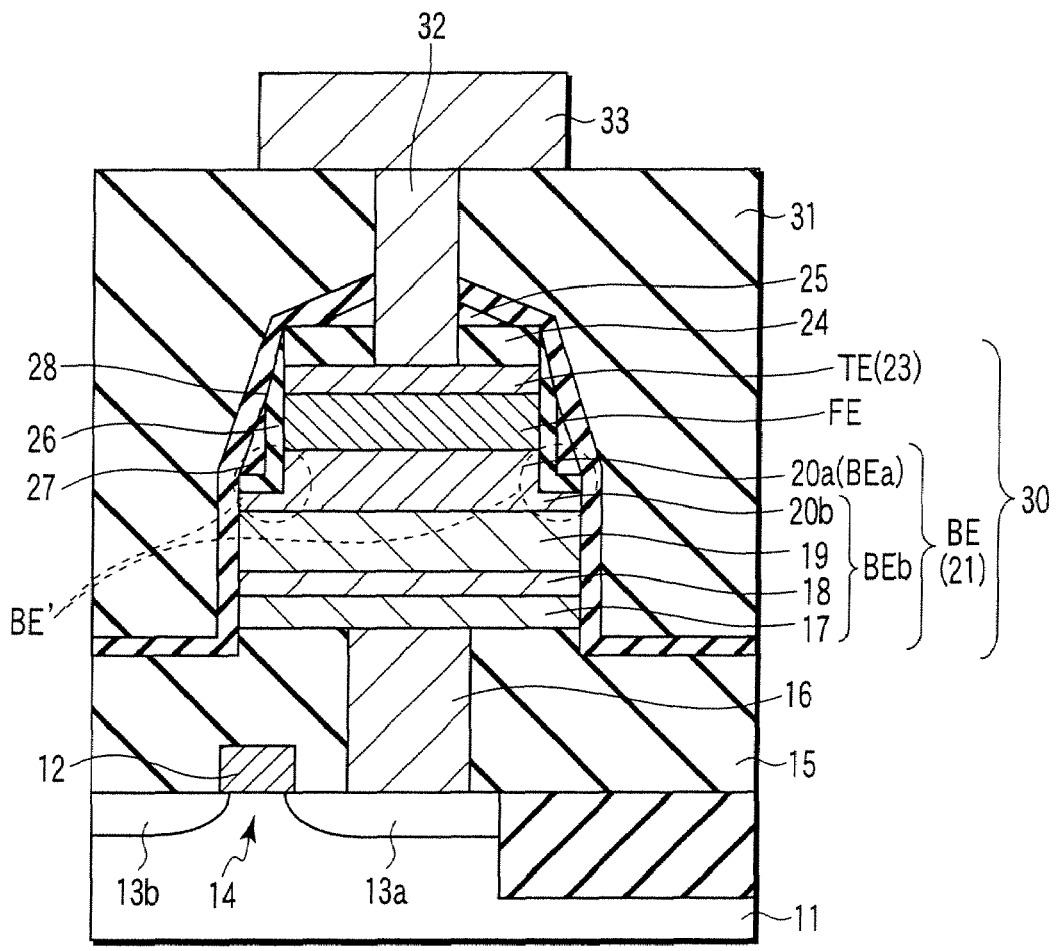
FIG. 18 is a sectional view showing a ferroelectric memory device according to the third embodiment of the present invention.
Figure 19:
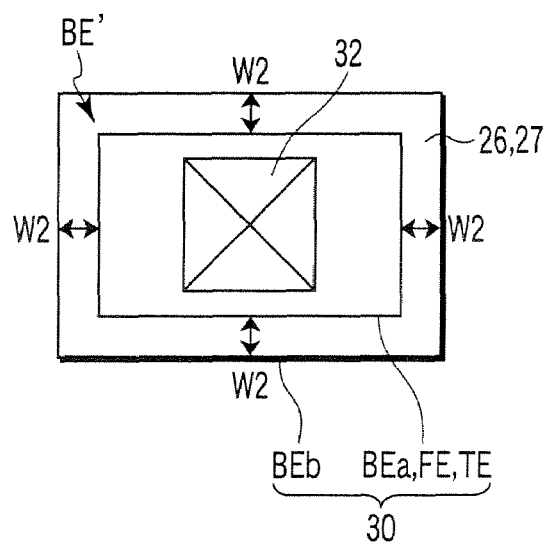
FIG. 19 is a schematic plan view showing a ferroelectric capacitor according to the third embodiment of the present invention.

FIG. 18 is a sectional view showing a ferroelectric memory device according to the third embodiment of the present invention. FIG. 19 is a schematic plan view showing a ferroelectric capacitor according to the third embodiment of the present invention. The ferroelectric memory device of the third embodiment will be described below.

As shown in FIGS. 18 and 19, the third embodiment is different from the second embodiment in that the side mask includes two side hard masks 26 and 27.

Each of the first and second side hard masks 26 and 27 is formed from at least one of a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. First and second top hard masks 24 and 25 and the first and second side hard masks 26 and 27 can be made of either the same material or different materials. The first and second side hard masks 26 and 27 can be made of either the same material or different materials.

In this embodiment, two side hard masks 26 and 27 are formed. However, three or more layers may be formed. An overetching amount X of a bottom electrode BE preferably satisfies inequality (2).

Figure 20:
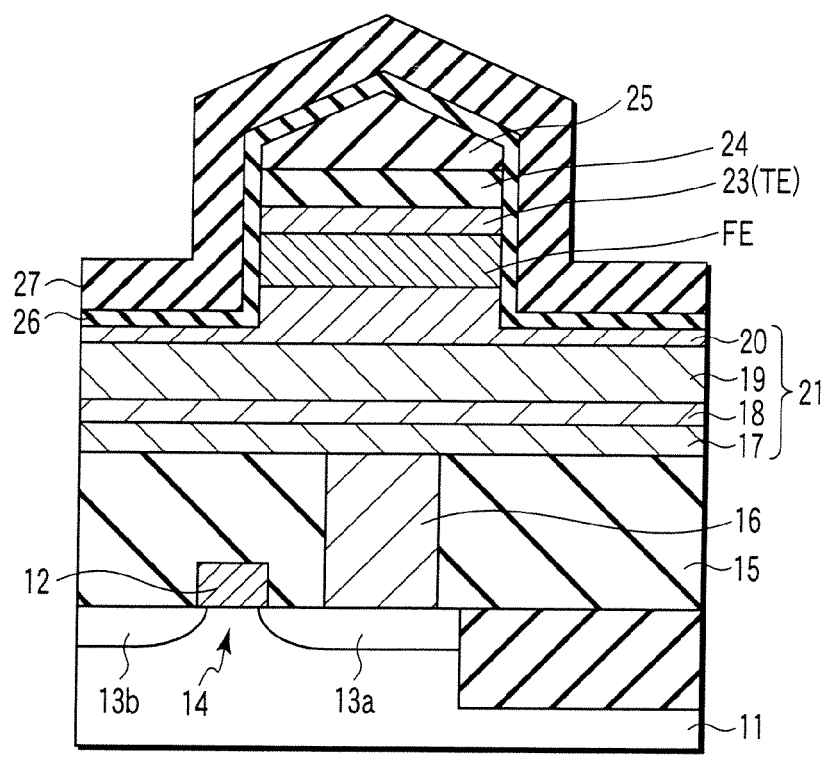
FIGS. 20 to 22 are sectional views showing steps in manufacturing the ferroelectric memory device according to the third embodiment of the present invention.
Figure 21:
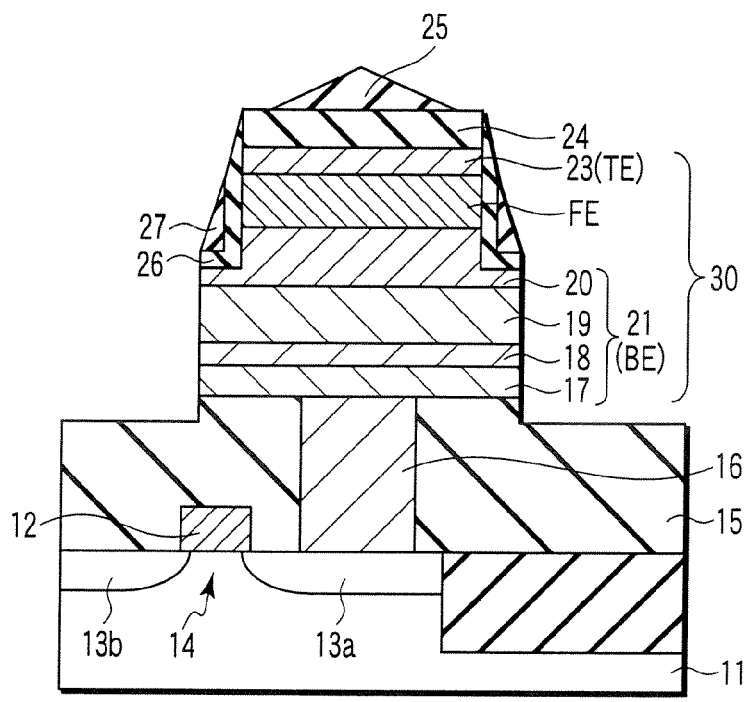
Figure 22:
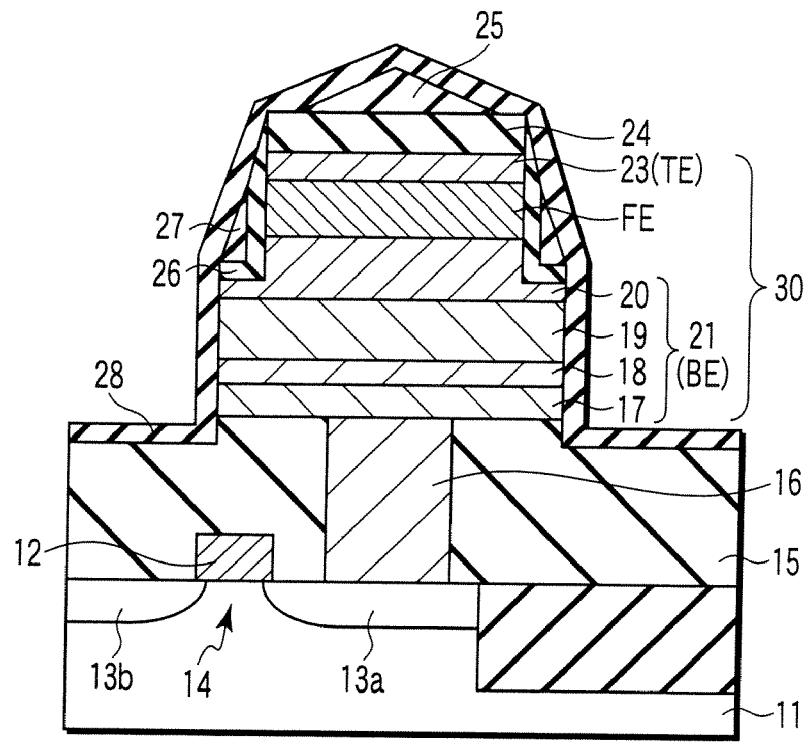

FIGS. 20 to 22 are sectional views showing steps in manufacturing the ferroelectric memory device according to the third embodiment of the present invention. The method of manufacturing the ferroelectric memory device according to the third embodiment will be described below.

First, the steps shown in FIGS. 13 and 14 are executed, as in the second embodiment.

Next, as shown in FIG. 20, the first and second side hard masks 26 and 27 are sequentially formed on the etching surfaces of the second top hard mask 25 and fourth bottom electrode material 20. As the first side hard mask 26, an aluminum oxide film ($Al_xO_y$ film: e.g., $Al_2O_3$ film) having a thickness of 20 nm is deposited by using one or both of ALD and sputtering. Then, as the second side hard mask 27, a silicon oxide film ($SiO_x$ film: e.g., $SiO_2$ film) having a thickness of 30 nm is deposited. Candidates of the first and second side hard masks 26 and 27 are a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a layered film thereof. After the second side hard mask 27 is deposited, high-temperature oxygen annealing is executed as needed to improve the polarization characteristic of the ferroelectric capacitor.

As shown in FIG. 21, the first and second side hard masks 26 and 27 are partially removed by overall etch-back process. After that, etching is executed again to process the rest of a bottom electrode material 21 (first to third bottom electrode materials 17 to 19 and part of the fourth bottom electrode material 20). With this process, the bottom electrode BE having a desired pattern is formed. A ferroelectric capacitor 30 is completed by the batch process. An interlayer dielectric film 15 may also be partially processed.

As shown in FIG. 22, a barrier film 28 is formed on the interlayer dielectric film 15 and second top hard mask 25 to suppress damage to the interlayer dielectric film 15. Examples of the barrier film 28 are a silicon oxide film ($SiO_x$ film: e.g., $SiO_2$ film), aluminum oxide film ($Al_xO_y$ film: e.g., $Al_2O_3$ film), silicon aluminum oxide film ($SiAl_xO_y$ film: e.g., SiAlO film), zirconium oxide film ($ZrO_x$ film: e.g., $ZrO_2$ film), silicon nitride film ($Si_xN_y$ film: e.g., $Si_3N_4$ film), and a combination thereof. In this case, an $Al_xO_y$ film having a thickness of 50 nm is deposited by using one or both of ALD and sputtering.

As shown in FIG. 18, an interlayer dielectric film 31 is formed on the barrier film 28. A contact 32 connected to a top electrode TE is formed through the interlayer dielectric film 31, barrier film 28, and first and second top hard masks 24 and 25. Then, an interconnection 33 connected to the contact 32 is formed. The ferroelectric memory device is formed in this manner.

According to the third embodiment, the same effects as in the second embodiment can be obtained. In addition, damage in processing the bottom electrode BE can be suppressed more completely by the two-layer structure of the side hard masks 26 and 27.

Fourth Embodiment

In the fourth embodiment, the third embodiment is applied to a ferroelectric memory with a TC parallel unit series connection structure. In the TC parallel unit series connection structure, two terminals of a capacitor (C) are respectively connected to the source and drain of a cell transistor (T) to form a unit cell, and a plurality of unit cells are connected in series.

Figure 23:
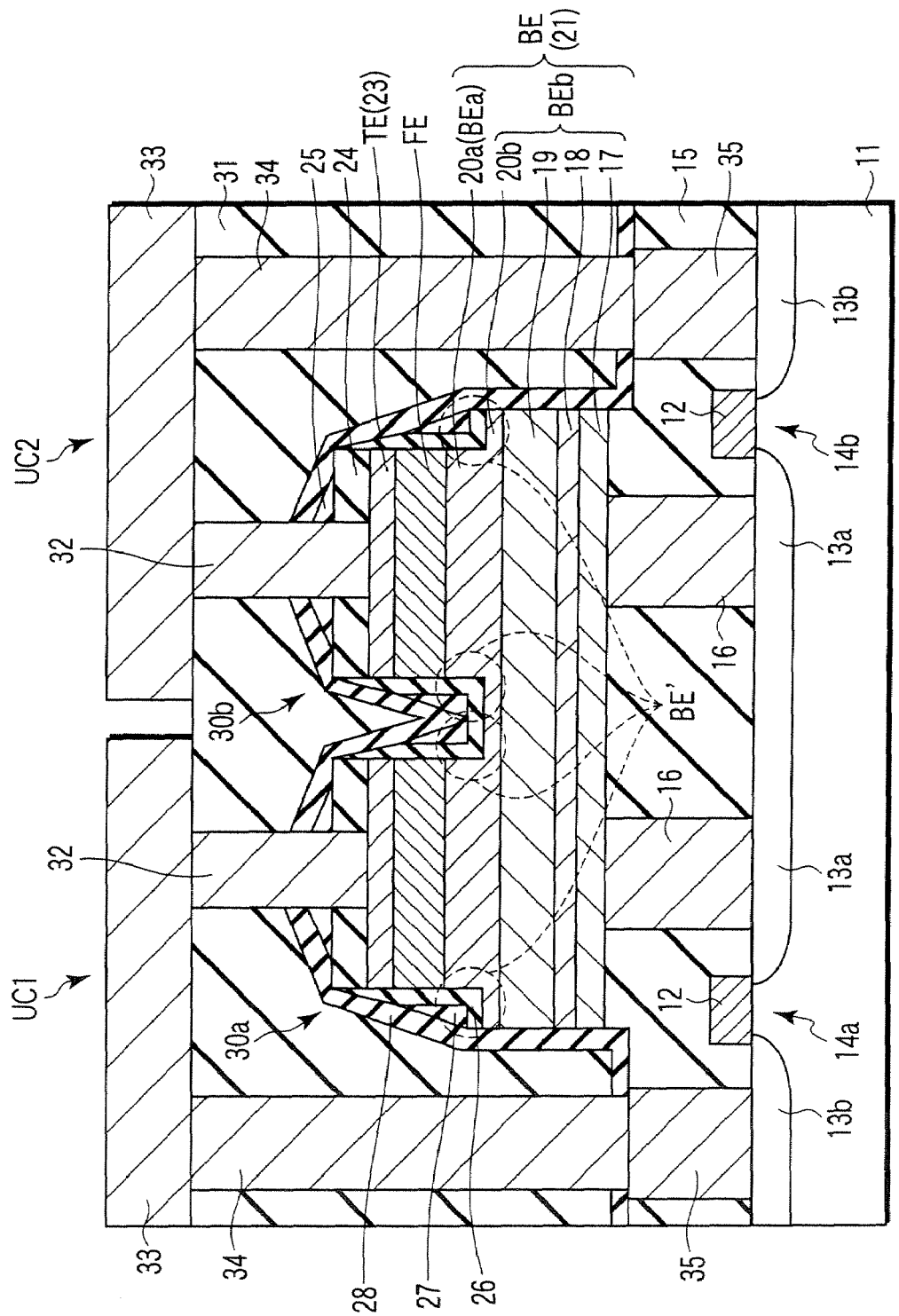
FIG. 23 is a sectional view showing a ferroelectric memory device according to the fourth embodiment of the present invention.
Figure 24:
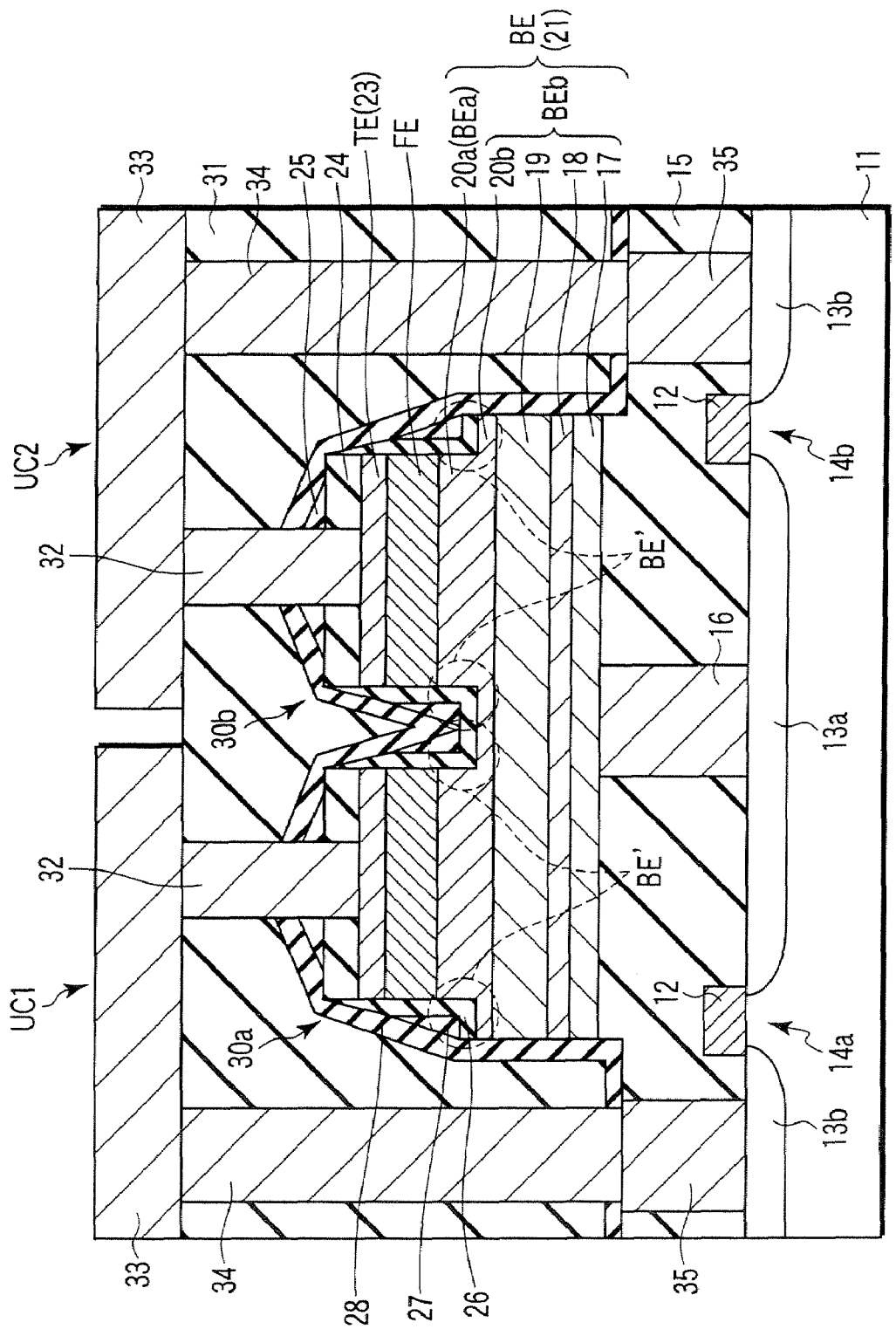
FIG. 24 is a sectional view showing another ferroelectric memory device according to the fourth embodiment of the present invention.

FIGS. 23 and 24 are sectional views showing ferroelectric memory devices according to the fourth embodiment of the present invention. The ferroelectric memory devices of the fourth embodiment will be described below.

As shown in FIGS. 23 and 24, the fourth embodiment is different from the third embodiment in that the TC parallel unit series connection structure is employed.

More specifically, a bottom electrode BE and top electrode TE of a ferroelectric capacitor 30a are respectively connected to source/drain diffusion layers 13a and 13b of a transistor 14a to form a unit cell UC1. Similarly, the bottom electrode BE and top electrode TE of a ferroelectric capacitor 30b are respectively connected to the source/drain diffusion layers 13a and 13b of a transistor 14b to form a unit cell UC2. The unit cells UC1 and UC2 are connected in series.

Since the bottom electrodes BE of the pair of ferroelectric capacitors 30a and 30b have an equipotential, the bottom electrodes BE can contact each other. Hence, the pair of ferroelectric capacitors 30a and 30b share the bottom electrode BE.

In the structure shown in FIG. 23, a plug 16 is provided in each of the ferroelectric capacitors 30a and 30b. On the other hand, in the structure shown in FIG. 24, the pair of ferroelectric capacitors 30a and 30b shares one plug 16. In the structure shown in FIG. 24, since the plug 16 is not arranged immediately under a ferroelectric film FE, the influence of the capacitor characteristic by the step of the plug 16 can be suppressed.

In the structure shown in FIG. 23, the adjacent transistors 14a and 14b share the source/drain diffusion layer 13a.

Figure 25:
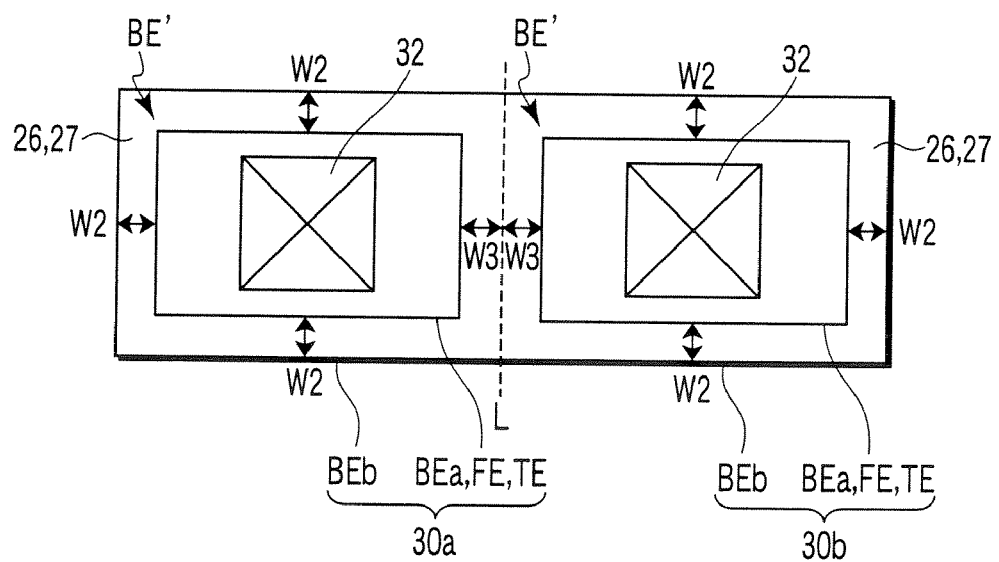
FIG. 25 is a schematic plan view showing a ferroelectric capacitor according to the fourth embodiment of the present invention.

FIG. 25 is a schematic plan view showing a ferroelectric capacitor according to the fourth embodiment of the present invention. As shown in FIG. 25, a projecting width W2 of a step BE' is uniform when viewed from right above, as in the third embodiment. Although the width W2 in FIG. 25 is illustrated uniformly, it varies depending on process conditions. More specifically, the width W2 basically becomes uniform symmetrically. The projecting width W2 of the step BE' is preferably $2{,}000 \times 10^{-10}$ m or less for micropatterning.

The width W3 basically becomes uniform symmetrically about the intermediate line between the two top electrodes TE. The projecting width W3 is smaller than the projecting width W2. The projecting widths W2 and W3 preferably satisfies $$(10 \times W3) < W2 \tag{3}$$

A change of the projecting widths W2 and W3 occurs by Micro-loading effect of the dry etching. A difference of a size of the projecting width W1 (FIG. 2) and W2 (FIGS. 11 and 19) is generated by a distance between the adjacent capacitors as shown in FIGS. 2, 11 and 19.

According to the fourth embodiment, the same effects as in the third embodiment can be obtained. Additionally, in the fourth embodiment, since the TC parallel unit series connection structure is employed, the cell area can be made smaller, and the capacity can be increased.

Fifth Embodiment

The fifth embodiment is a modification to the first embodiment. Two hard masks are formed on the top electrode.

Figure 26:
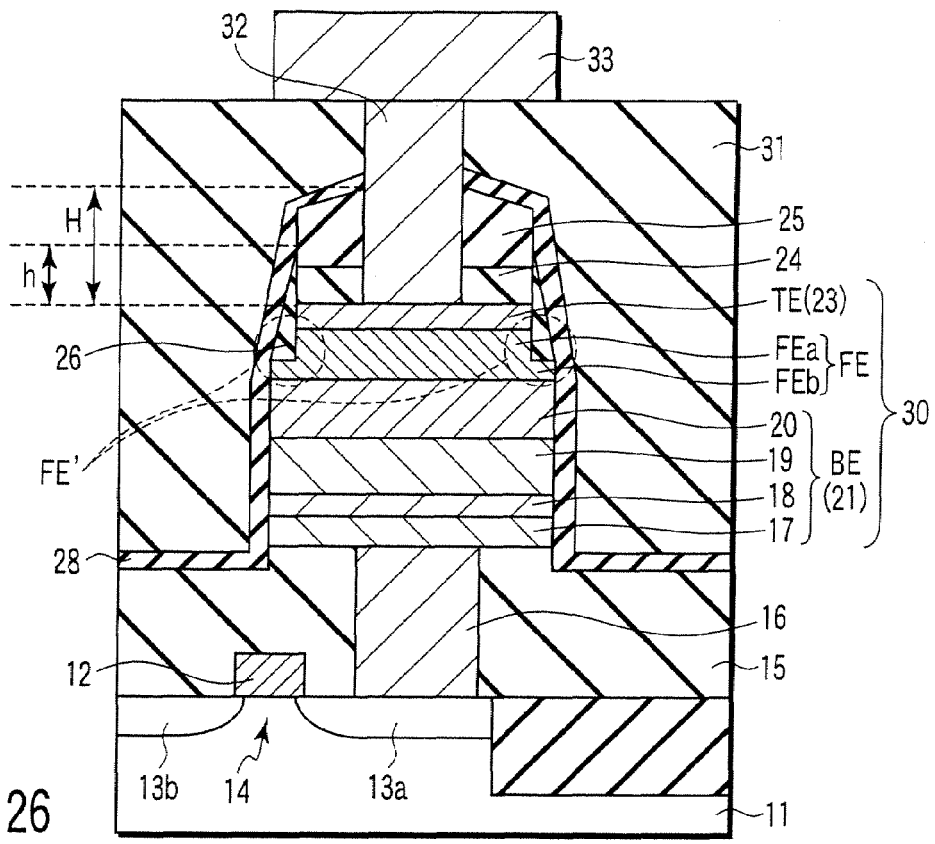
FIG. 26 is a sectional view showing a ferroelectric memory device according to the fifth embodiment of the present invention.

FIGS. 26 an 27 are sectional views showing ferroelectric memory devices according to the fifth embodiment of the present invention. The ferroelectric memory devices according to the fifth embodiment will be described below.

Figure 27:
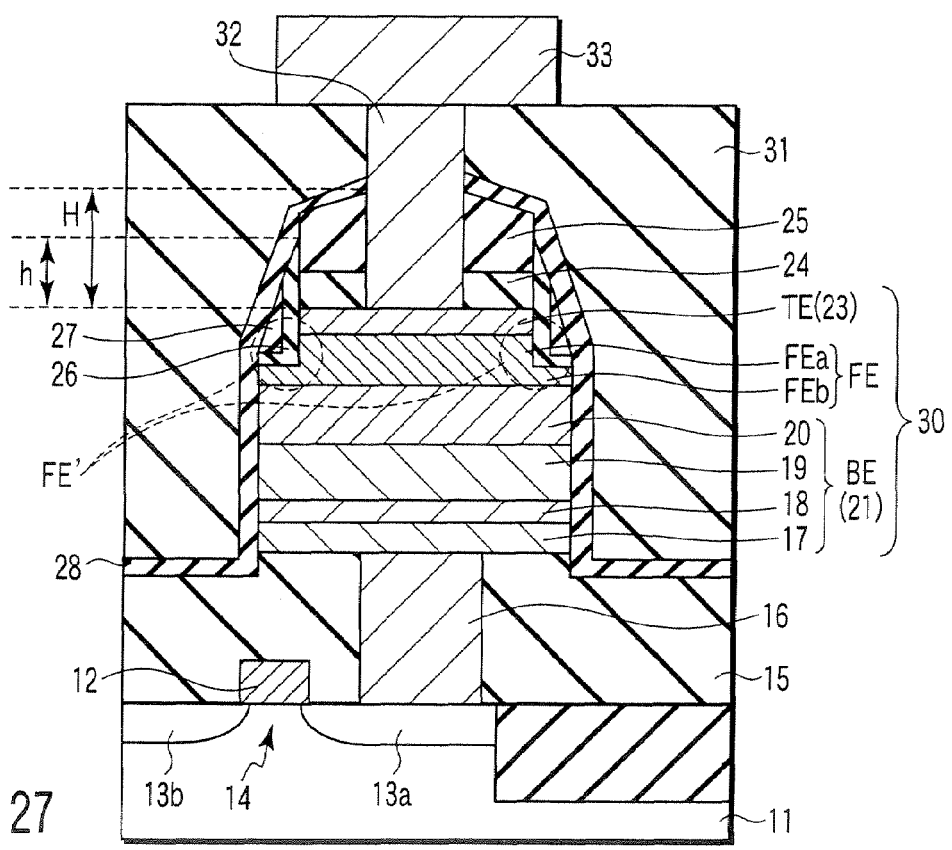
FIG. 27 is a sectional view showing another ferroelectric memory device according to the fifth embodiment of the present invention.

As shown in FIGS. 26 and 27, the fifth embodiment is different from the first embodiment in that two top hard masks 24 and 25 are provided on a top electrode TE. In the structure shown in FIG. 27, two side hard masks 26 and 27 are provided.

Even in this embodiment, inequality (1) is preferably satisfied. In this case, a height H is the height from the top of the top electrode TE to the top of the second top hard mask 25.

Since details of the top hard masks 24 and 25 are the same as in the second embedment, and details of the side hard masks 26 and 27 are the same as in the third embodiment, a description thereof will be omitted.

According to the fifth embodiment, the same effects as in the first embodiment can be obtained. Additionally, in the fifth embodiment, the first top hard mask 24 prevents damage to the second top hard mask 25 from influencing the top electrode TE. Furthermore, damage in processing a bottom electrode BE can be suppressed more completely by the two-layer structure of the side hard masks 26 and 27.

Sixth Embodiment

The sixth embodiment is a modification to the second embodiment. The top of the side hard mask is located at a lower level than the top of the top hard mask.

Figure 28:
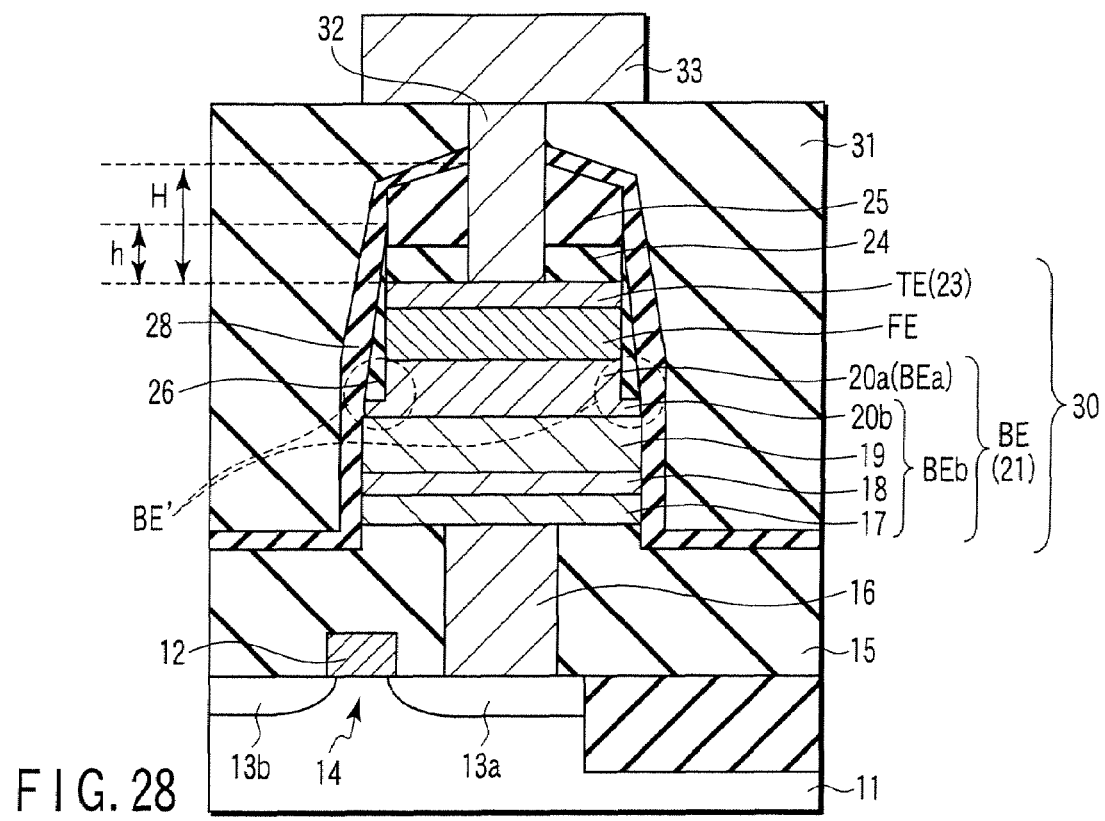
FIG. 28 is a sectional view showing a ferroelectric memory device according to the sixth embodiment of the present invention.

FIG. 28 is a sectional view showing a ferroelectric memory device according to the sixth embodiment of the present invention. The ferroelectric memory device according to the sixth embodiment will be described below.

As shown in FIG. 28, the sixth embodiment is different from the second embodiment in that the top of a side hard mask 26 is located at a lower level than the top of a second top hard mask 25.

Let H be the height from the top of a top electrode TE to the top of the second top hard mask 25, and h be the height from the top of the top electrode TE to the top of the side hard mask 26. The ratio h/H preferably satisfies inequality (1). An overetching amount X of a bottom electrode BE preferably satisfies inequality (2).

According to the sixth embodiment, the same effects as in the second embodiment can be obtained. In addition, when the top of the side hard mask 26 is at a lower level than the top of the second top hard mask 25, the width of a ferroelectric capacitor 30 can be decreased so that the cell size can be reduced.

As indicated by inequality (1), when the ratio h/H is defined in the range of 1% (inclusive) to 99% (inclusive), the variation in signal amount can be reduced, and the signal amount can be increased while reducing the cell size.

Figure 29:
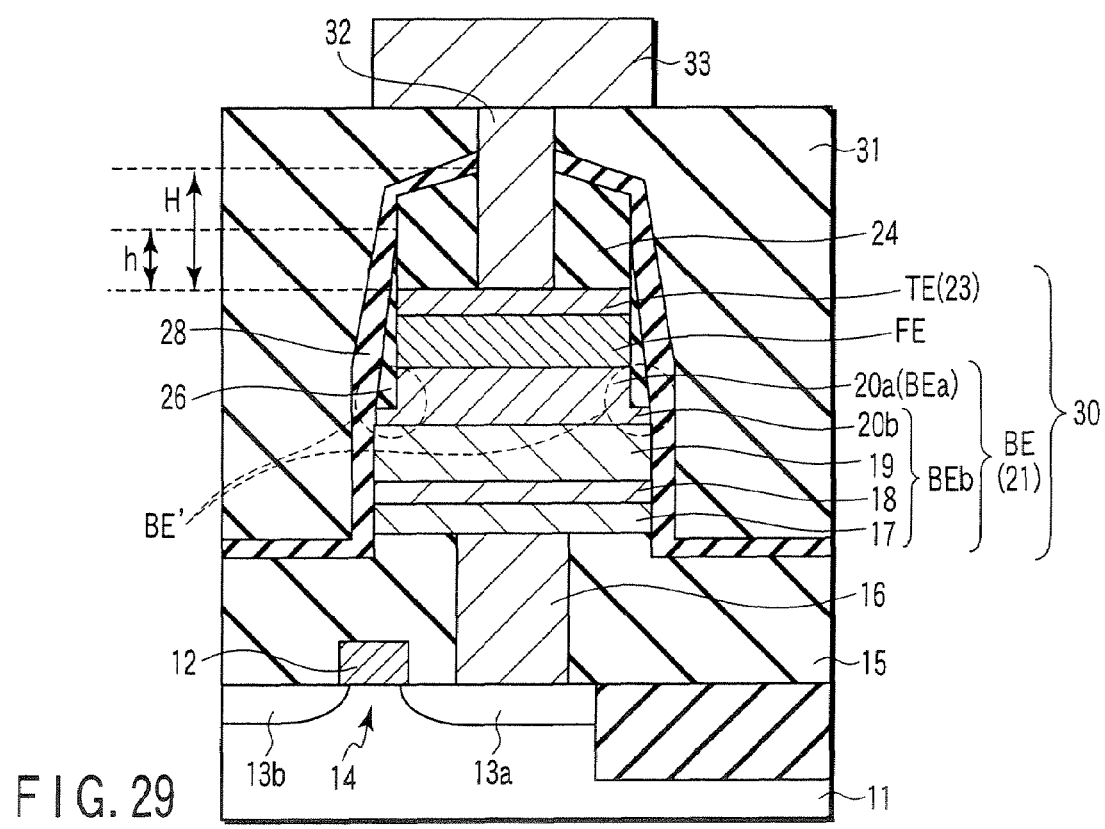
FIG. 29 is a sectional view showing another ferroelectric memory device according to the sixth embodiment of the present invention.

In the sixth embodiment, one top hard mask 24 may be used, as shown in FIG. 29.

Seventh Embodiment

The seventh embodiment is a modification to the third embodiment. The top of the first side hard mask is located at a lower level than the top of the top hard mask.

Figure 30:
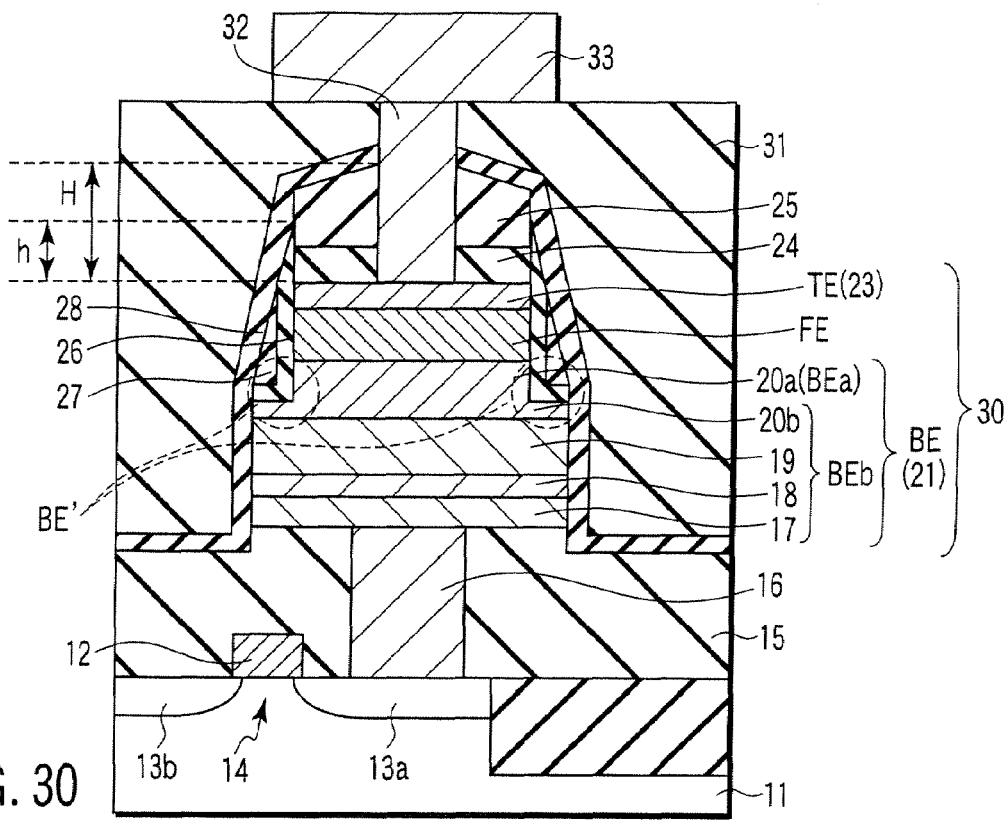
FIG. 30 is a sectional view showing a ferroelectric memory device according to the seventh embodiment of the present invention.

FIG. 30 is a sectional view showing a ferroelectric memory device according to the seventh embodiment of the present invention. The ferroelectric memory device according to the seventh embodiment will be described below.

As shown in FIG. 30, the seventh embodiment is different from the third embodiment in that the top of a first side hard mask 26 is located at a lower level than the top of a second top hard mask 25.

Let H be the height from the top of a top electrode TE to the top of the second top hard mask 25, and h be the height from the top of the top electrode TE to the top of the first side hard mask 26. The ratio h/H preferably satisfies inequality (1). An overetching amount X of a bottom electrode BE preferably satisfies inequality (2).

According to the seventh embodiment, the same effects as in the third embodiment can be obtained. In addition, when the top of the first side hard mask 26 is at a lower level than the top of the second top hard mask 25, the width of a ferroelectric capacitor 30 can be decreased so that the cell size can be reduced.

As indicated by inequality (1), when the ratio h/H is defined in the range of 1% (inclusive) to 99% (inclusive), the variation in signal amount can be reduced, and the signal amount can be increased while reducing the cell size.

Figure 31:
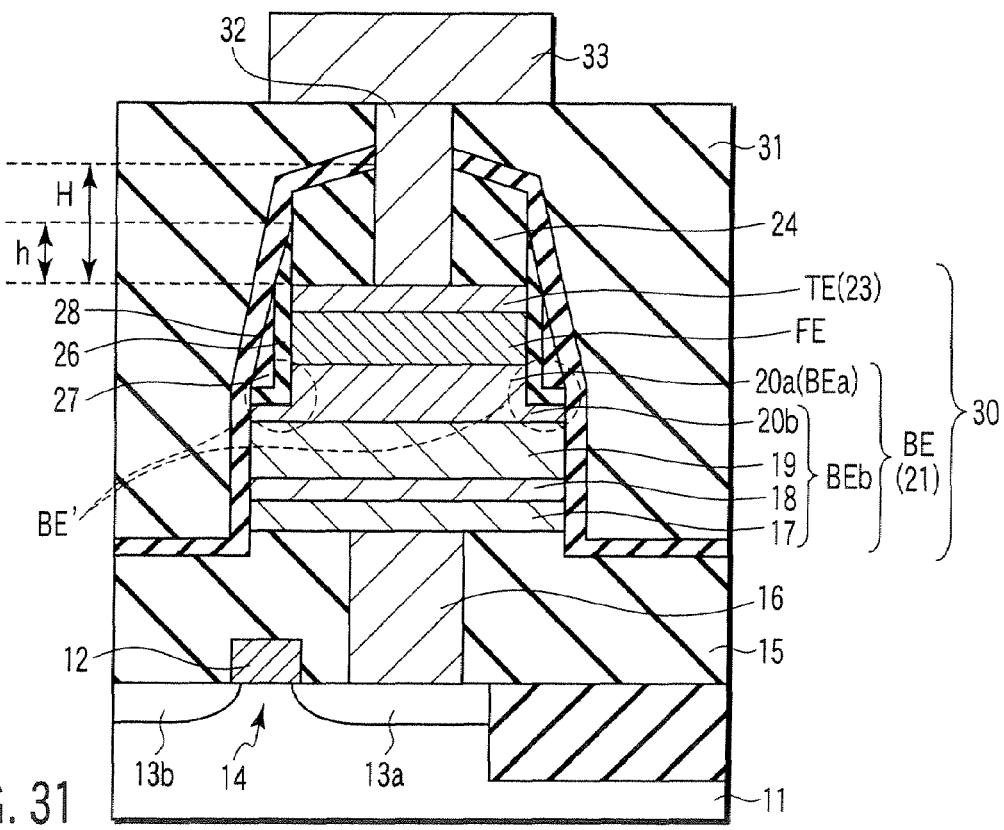
FIG. 31 is a sectional view showing another ferroelectric memory device according to the seventh embodiment of the present invention.

In the seventh embodiment, one top hard mask 24 may be used, as shown in FIG. 31.

Eighth Embodiment

In the eighth embodiment, the first embodiment is applied to a ferroelectric memory with a TC parallel unit series connection structure.

Figure 32:
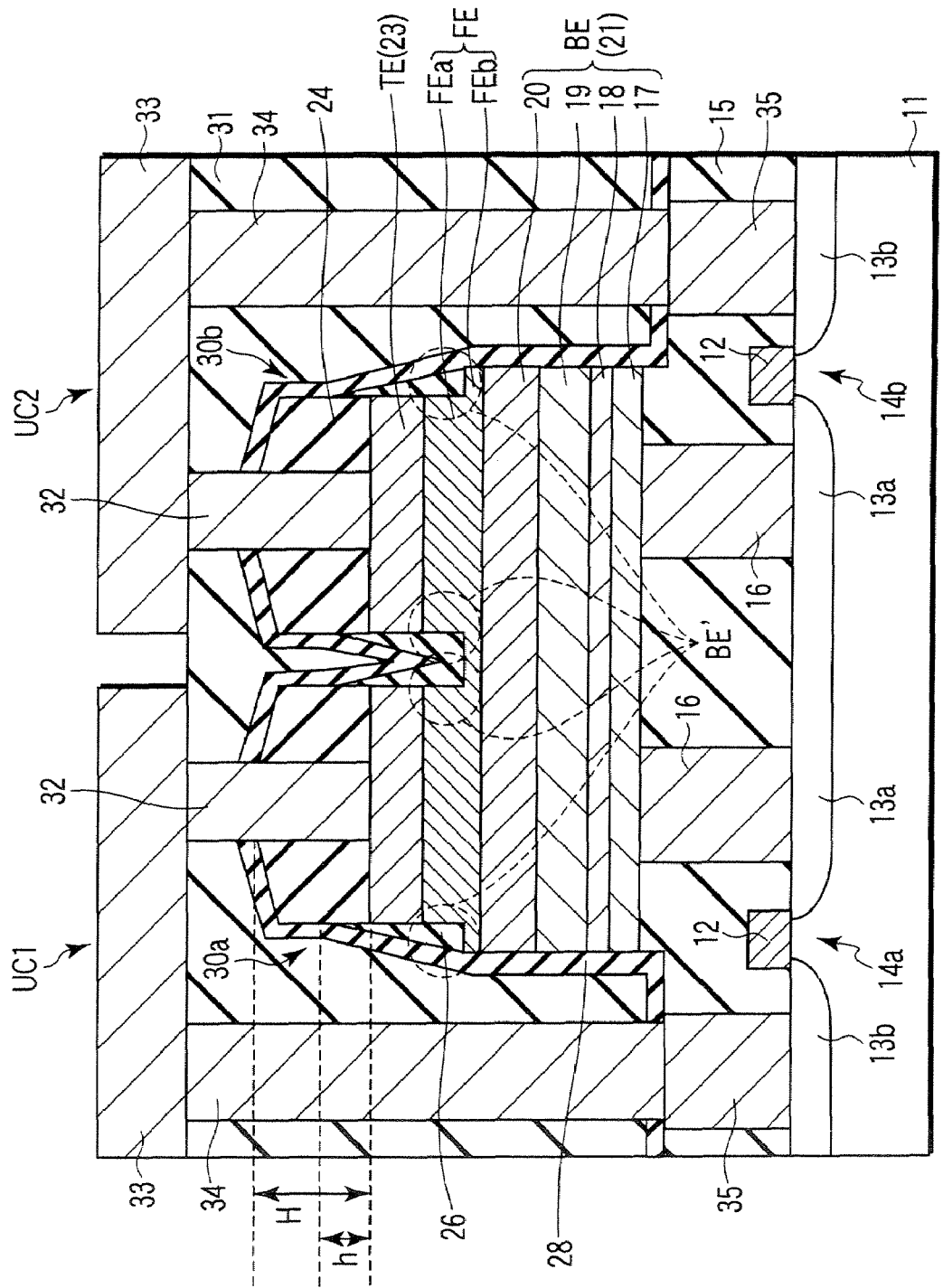
FIG. 32 is a sectional view showing a ferroelectric memory device according to the eighth embodiment of the present invention.

FIG. 32 is a sectional view showing a ferroelectric memory device according to the eighth embodiment of the present invention. The ferroelectric memory device according to the eighth embodiment will be described below.

As shown in FIG. 32, the eighth embodiment is different from the first embodiment in that the TC parallel unit series connection structure is employed.

More specifically, a bottom electrode BE and top electrode TE of a ferroelectric capacitor 30a are respectively connected to source/drain diffusion layers 13a and 13b of a transistor 14a to form a unit cell UC1. Similarly, the bottom electrode BE and top electrode TE of a ferroelectric capacitor 30b are respectively connected to the source/drain diffusion layers 13a and 13b of a transistor 14b to form a unit cell UC2. The unit cells UC1 and UC2 are connected in series.

Let H be the height from the top of the top electrode TE to the top of a top hard mask 24, and h be the height from the top of the top electrode TE to the top of a side hard mask 26. The ratio h/H preferably satisfies inequality (1).

According to the eighth embodiment, the same effects as in the first embodiment can be obtained. Additionally, in the eighth embodiment, since the TC parallel unit series connection structure is employed, the cell area can be made smaller, and the capacity can be increased.

As indicated by inequality (1), when the ratio h/H is defined in the range of 1% (inclusive) to 99% (inclusive), the variation in signal amount can be reduced, and the signal amount can be increased while reducing the cell size.

Figure 33:
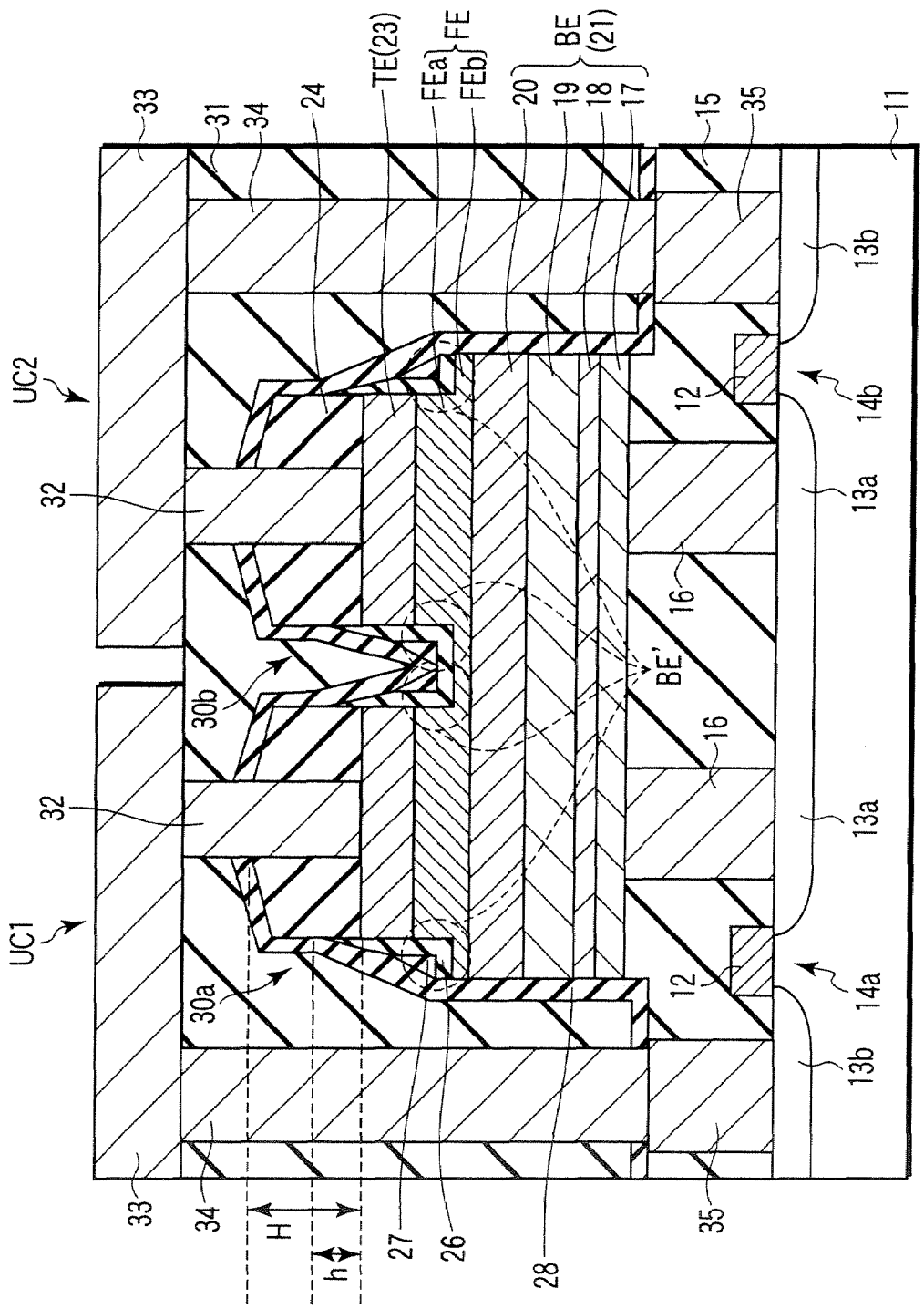
FIG. 33 is a sectional view showing another ferroelectric memory device according to the eighth embodiment of the present invention.

In the eighth embodiment, two side hard masks 26 and 27 may be used, as shown in FIG. 33. The top hard mask 24 may have two layers. The pair of ferroelectric capacitors 30a and 30b may share one plug 16.

In the above-described embodiments, the side surface of the top electrode TE and that of the ferroelectric film FE, and the side surface of the ferroelectric film FE and that of the bottom electrode BE are illustrated vertically. Actually, the process residue can be suppressed more effectively when the side surface of the top electrode TE and that of the ferroelectric film FE have a taper angle of 70° to 88°, and the side surface of the ferroelectric film FE and that of the bottom electrode BE have a taper angle of 60° to 88°.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
a top electrode of a ferroelectric capacitor;
a bottom electrode of the ferroelectric capacitor;
a ferroelectric film which is sandwiched between the top electrode and the bottom electrode, said ferroelectric film including a first portion having a side surface flushed with a side surface of the top electrode and a second portion having a side surface flushed with a side surface of the bottom electrode, the first and second portions forming a step by making the side surface of the second portion project outward from the side surface of the first portion;

a top mask which is provided on the top electrode; and a side mask which is provided on part of a side surface of the top mask, the side surface of the top electrode, and the side surface of the first portion of the ferroelectric film, the side mask including a top at a lower level than a top of the top mask and at a higher level than a top of the top electrode, the side mask including a plurality of mask layers.

2. The device according to claim 1, wherein H is a height from the top of the top electrode to the top of the top mask, and h is a height from the top of the top electrode to the top of the side mask, an inequality given by $1\% \leqq h/H \leqq 99\%$ is satisfied.

3. The device according to claim 1, wherein the top mask includes a plurality of mask layers.

4. The device according to claim 1, wherein the top mask is formed from at least one of a silicon oxide film, an aluminum oxide film, a silicon aluminum oxide film, a zirconium oxide film, a silicon nitride film, and a layered film thereof.

5. The device according to claim 1, wherein the side mask is formed from at least one of a silicon oxide film, an aluminum oxide film, a silicon aluminum oxide film, a zirconium oxide film, a silicon nitride film, and a layered film thereof.

6. The device according to claim 1, further comprising:

a barrier film which covers the top mask, the side mask, and the ferroelectric capacitor.

7. The device according to claim 6, wherein the barrier film is formed from at least one of a silicon oxide film, an aluminum oxide film, a silicon aluminum oxide film, a zirconium oxide film, a silicon nitride film, and a layered film thereof.

* * * * *